(12) United States Patent
Minamisawa

(10) Patent No.: US 11,340,470 B2
(45) Date of Patent: May 24, 2022

(54) OPTICAL UNIT WITH SHAKE CORRECTION FUNCTION

(71) Applicant: NIDEC SANKYO CORPORATION, Nagano (JP)

(72) Inventor: Shinji Minamisawa, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 403 days.

(21) Appl. No.: 16/290,008

(22) Filed: Mar. 1, 2019

(65) Prior Publication Data

US 2019/0278101 A1 Sep. 12, 2019

(30) Foreign Application Priority Data

Mar. 6, 2018 (JP) .............................. JP2018-039357

(51) Int. Cl.
  *G02B 27/64* (2006.01)
  *G03B 5/06* (2021.01)
  *H05K 1/18* (2006.01)
  *H04N 5/232* (2006.01)

(52) U.S. Cl.
  CPC ............. *G02B 27/646* (2013.01); *G03B 5/06* (2013.01); *H04N 5/2328* (2013.01); *H05K 1/189* (2013.01); *G03B 2205/0007* (2013.01); *G03B 2205/0069* (2013.01); *H05K 2201/10121* (2013.01)

(58) Field of Classification Search
  CPC ................. G02B 27/646; G03B 5/06; G03B 2205/0007; G03B 2205/0069; G03B 2205/0023; H05K 2201/10121; H05K 1/189; H04N 5/2328; H04N 5/2254; H04N 5/2257; H04N 5/23287
  USPC ................................................... 359/554, 557
  See application file for complete search history.

(56) References Cited

U.S. PATENT DOCUMENTS

| 2013/0136437 A1* | 5/2013 | Asakawa | G03B 5/00 396/55 |
| 2013/0163974 A1* | 6/2013 | Takei | G03B 5/00 396/55 |

FOREIGN PATENT DOCUMENTS

JP    2016061958 A    4/2016

\* cited by examiner

*Primary Examiner* — Jennifer D. Carruth
*Assistant Examiner* — Jyotsna V Dabbi
(74) *Attorney, Agent, or Firm* — Cantor Colburn LLP

(57) ABSTRACT

An optical unit with a shake correction function may include an optical module having an optical element and an image pickup element, a movable body holding the optical module, a swing support mechanism swingably supporting the movable body, a fixed body supporting the movable body through the swing support mechanism, a shake correction drive mechanism structured to swing the movable body, and a stopper mechanism structured to restrict a movable range of the movable body. The stopper mechanism may include a spacer member in the movable body which includes a stopper protruded part extended to an opposite side to an object to be photographed with respect to the image pickup element, and a stopper member to abut with the stopper protruded part of the spacer member. The spacer member may be fixed to a member different from the optical module in the movable body.

5 Claims, 14 Drawing Sheets

OPTICAL UNIT WITH SHAKE CORRECTION FUNCTION

CROSS REFERENCE TO RELATED APPLICATION

The present application claims priority under 35 U.S.C. § 119 to Japanese Application No. 2018-039357 filed Mar. 6, 2018, the entire content of which is incorporated herein by reference.

TECHNICAL FIELD

The present invention relates to an optical unit with a shake correction function structured to perform a shake correction of an optical module which is mounted on a portable terminal with a camera or the like.

BACKGROUND

In an optical unit used in an optical device such as an imaging device which is mounted on a portable terminal, a drive recorder, an unmanned helicopter or the like, in order to restrain a disturbance of a photographed image due to a shake, a function has been developed in which an optical module is swung to cancel a shake and correct the shake. In the shake correction function, a structure is adopted that an optical module having an optical element is swingably supported with respect to a fixed body comprised of a housing of an optical device, and the optical module is swung by a shake correction drive mechanism depending on a shake. The shake correction drive mechanism includes a magnet and a coil and, it is structured that an electromagnetic force is acted on the optical module to drive by supplying an electric current to the coil in a magnetic field of the magnet.

For example, in Japanese Patent Laid-Open No. 2016-061958 (Patent Literature 1), a structure is proposed that an optical module is swingably supported by a gimbal mechanism which uses a plate-shaped spring provided with support points in two directions perpendicular to an optical axis direction of the optical module and a shake is corrected by swinging the optical module (movable body).

In this type of optical unit with a shake correction function, when a movable body provided with an optical module which is swung depending on a shake is swung excessively, deformation is occurred in the gimbal mechanism and the like, and malfunction may occur in an operation later. In order to prevent this problem, in Patent Literature 1, a stopper restricting a swing allowable range of a movable body is provided. In this case, a protruded part (first protruded part and second protruded part) is provided at an upper end of a holder which holds a coil so as to protrude to an upper side and a cushion member is provided on a rear face of a cover of a fixed body which covers the holder, and the cushion member is disposed on an upper side to the protruded part of the holder and thereby, when the holder as a movable body is swung, the protruded part of the holder is abutted with the cushion member and thus, the swing allowable range is restricted. Further, also in a case that the movable body is displaced to one side (object to be photographed side) in an optical axis direction by an external force, the first protruded part is abutted with the cushion member to restrict a moving range. Further, a third protruded part is also provided for restricting the moving range by abutting with a stopper member when the movable body is displaced to an opposite side to the object to be photographed side.

An image pickup element is provided on an opposite side to the object side of the holder in the optical axis direction and the third protruded part provided on an opposite side to the object side is provided in the vicinity of the image pickup element. Therefore, when an impact is applied, the impact may be transmitted to the image pickup element. In order to prevent this problem, it is conceivable that the third protruded part is provided at a further separated position from the lens holder surrounding the image pickup element to an outer side. However, in this case, a movable range of the third protruded part becomes large at the time of swinging and thus the size is increased. Especially, in recent years, a large-sized image pickup element has been used for coping with "4K" and thus the device tends to become further large.

SUMMARY

In view of the problems described above, at least an embodiment of the present invention provides an optical unit with a shake correction function in which, while surely restricting a movement in an optical axis direction of the movable body due to a drop impact, transmission of the impact to the image pickup element is restrained and, in addition, the size is reduced.

To achieve the above mentioned objective, at least an embodiment of the present invention provides an optical unit with a shake correction function including an optical module having an optical element and an image pickup element located on an optical axis of the optical element, a movable body which holds the optical module, a swing support mechanism which swingably supports the movable body, a fixed body which supports the movable body through the swing support mechanism, a shake correction drive mechanism structured to swing the movable body, and a stopper mechanism structured to restrict a movable range of the movable body when the movable body is moved in a direction of the optical axis. The stopper mechanism includes a spacer member which is provided in the movable body and has a stopper protruded part extended to an opposite side to an object to be photographed in the direction of the optical axis with respect to the image pickup element, and a stopper member which is capable of abutting with the stopper protruded part of the spacer member when the movable body is moved to the opposite side to the object to be photographed along the direction of the optical axis, and the spacer member is fixed to a member different from the optical module in the movable body.

When the movable body is moved in a direction opposite to an object side in an optical axis direction due to an impact or the like, the stopper protruded part is abutted with the stopper member to restrict a moving range of the movable body. In this case, the stopper protruded part is provided in the spacer member which is fixed to a member different from the optical module and thus an impact force when the stopper protruded part is abutted with the stopper member is not directly transmitted to the optical module. Therefore, the optical module can be effectively protected from an impact. Accordingly, the spacer member can be provided in the vicinity of the optical module and thus the size can be reduced.

In at least an embodiment of the present invention, the stopper protruded part is provided at a position so as not to be overlapped with the image pickup element when viewed in the direction of the optical axis.

The stopper protruded part and the image pickup element are arranged so as not to be overlapped with each other in the optical axis direction and thus, even if the stopper protruded part is deformed due to an impact, the image pickup element is restrained from being affected. In this case, it may be structured that, although the stopper protruded part and the image pickup element are arranged so as not to overlap with each other in the optical axis direction, the stopper protruded part is overlapped with a portion of the optical module which is disposed on an outer side of the image pickup element. Also in this case, the stopper protruded part is overlapped with the optical module at an outer side position with respect to the image pickup element and thus, the image pickup element can be prevented from being directly affected by an impact force.

In at least an embodiment of the present invention, the shake correction drive mechanism is structured of a magnet and a coil, the movable body includes a holder frame which holds one of the magnet and the coil of the shake correction drive mechanism, and the spacer member is abutted with the holder frame through a face intersecting the direction of the optical axis.

According to this structure, an impact force is transmitted to the holder frame through the spacer member without being applied to the optical module and thus the optical module can be surely protected.

In at least an embodiment of the present invention, a tip end of the stopper protruded part facing the stopper member is formed in a circular arc shape with a swing center position of the swing support mechanism as a swing center when viewed in a direction perpendicular to the direction of the optical axis.

According to this structure, a tip end of the stopper protruded part is formed in a circular arc shape with the swing support point as a swing center and thus, when a shake correction is to be performed, the stopper protruded part does not contact with the stopper member and a swing of the movable body at the time of a shake correction is not disturbed.

In at least an embodiment of the present invention, the stopper protruded part includes a first protruded part and a second protruded part which are separated from each other in a direction perpendicular to the direction of the optical axis, and the image pickup element is interposed between the first protruded part and the second protruded part.

According to this arrangement, when the stopper protruded part is abutted with the stopper member, the impact is not directly transmitted to the image pickup element and thus damage or the like of the image pickup element can be surely prevented. In this case, the circular arc shapes of the tip ends of the first protruded part and the second protruded part are formed in the same direction as each other.

In at least an embodiment of the present invention, the first protruded part and the second protruded part are connected with each other through a bridge part on an opposite side to the object to be photographed in the direction of the optical axis with respect to the image pickup element. According to this structure, the first protruded part and the second protruded part can be reinforced by the bridge part and thus strength enduring an impact can be secured.

In at least an embodiment of the present invention, the optical unit with a shake correction function further includes a flexible circuit board which is electrically connected with the image pickup element, and the flexible circuit board is disposed so as to be extended between the first protruded part and the second protruded part. According to this structure, the flexible circuit board does not interfere with the first protruded part or the second protruded part and thus the flexible circuit board is not damaged by being sandwiched between the movable body and the fixed body.

In at least an embodiment of the present invention, the spacer member is provided with a circuit board holding part which holds the flexible circuit board. According to this structure, the flexible circuit board is held by the spacer member which is a part of the movable body and thus a swing movement can be performed smoothly.

In at least an embodiment of the present invention, the circuit board holding part includes a circuit board receiving part which supports the flexible circuit board in a placed state on a side of the first protruded part and the second protruded part of the spacer member, and the flexible circuit board supported by the circuit board receiving part is disposed along an under face of the bridge part.

According to this structure, the flexible circuit board is disposed along an under face of the bridge part in a state that the flexible circuit board is supported by the circuit board receiving part. Therefore, the flexible circuit board is supported in a state that front and back faces of the flexible circuit board is sandwiched by the circuit board receiving part and the bridge part and thus the flexible circuit board is surely held by the spacer member.

In at least an embodiment of the present invention, the spacer member is provided with a chamfer part for avoiding contact with the magnet or the coil provided in the fixed body at the time of a swing on an outer side face of a portion of the spacer member which is abutted with the holder frame.

The magnet and the coil which are respectively held by the holder frame and the fixed body are disposed close to each other. Therefore, the spacer member provided in the holder in an abutted state is also disposed close to the magnet or the coil which is held by the fixed body. However, according to this structure, the chamfer part is provided and thus a movement at the time of a swing is not disturbed.

Effects of the Invention

According to at least an embodiment of the present invention, while a movement in the optical axis direction of the movable body due to a drop impact or the like is surely restricted, transmission of the impact to the image pickup element is restrained and, in addition, the size can be reduced.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 16A shows a non-excitation state and FIG. 16B shows a state at the time of a maximum swing of a movable body.

DETAILED DESCRIPTION

An optical unit with a shake correction function in accordance with at least an embodiment of the present invention will be described below with reference to the accompanying drawings. In the following descriptions, three directions perpendicular to each other are respectively set in an "X"-axis direction, a "Y"-axis direction and a "Z"-axis direction and, in a stationary state, it is assumed that an optical axis "L" (lens optical axis/optical axis of an optical element) is disposed in the "Z"-axis direction. Further, regarding shakes in the respective directions, a turning around the "X"-axis corresponds to so-called pitching (vertical swing), a turning around the "Y"-axis corresponds to so-called yawing (lateral swing). Further, "+X" is indicated on one side in the "X"-axis direction, "−X" is indicated on the other side, "+Y" is indicated on one side in the "Y"-axis direction, "−Y" is indicated on the other side, "+Z" is indicated on one side in the "Z"-axis direction (object side/front side in the optical axis direction), and "−Z" is indicated on the other side (opposite side to an object side/rear side in the optical axis direction). Further, in FIG. 1 through FIG. 14, a state that one side "+Z" is disposed on an upper side in the "Z"-axis is a stationary state. The following is described in a stationary state unless otherwise specified.

(Schematic Structure of Optical Unit 101 With Shake Correction Function)

Figure 1:
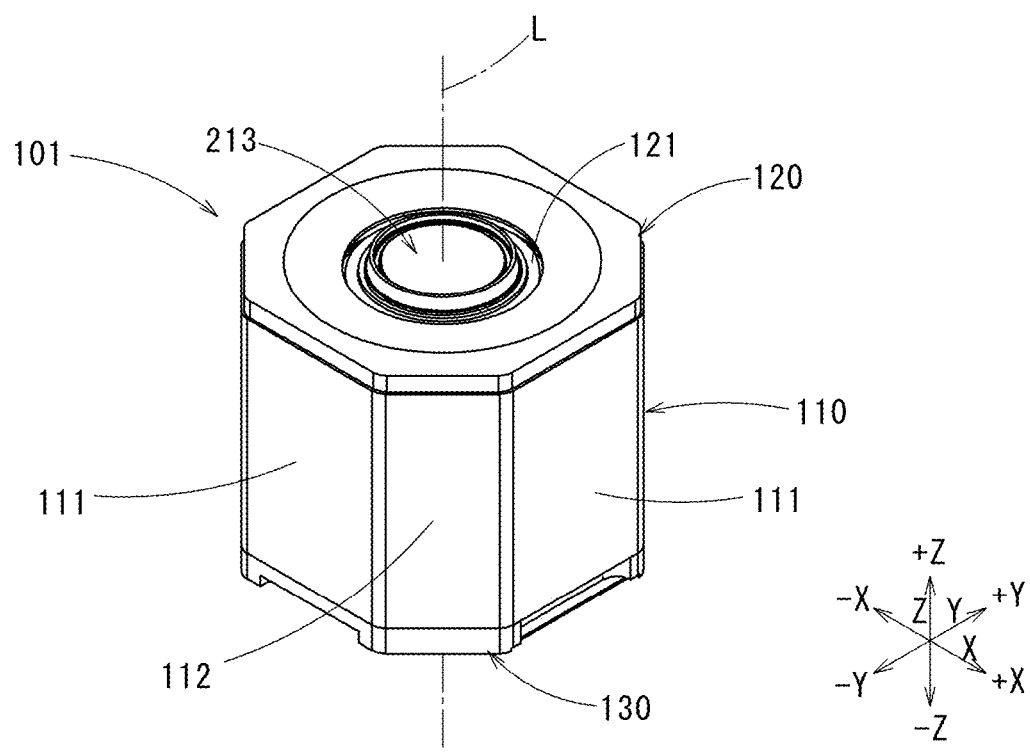
FIG. 1 is a perspective view showing an assembled state of an optical unit with a shake correction function in accordance with at least an embodiment of the present invention.
Figure 2:
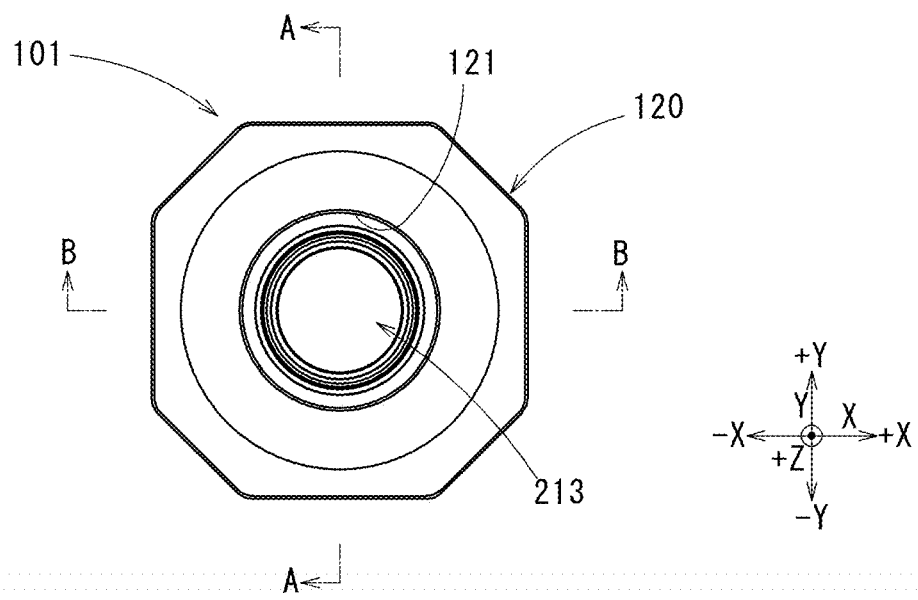
FIG. 2 is a plan view showing an optical unit with a shake correction function in accordance with at least an embodiment of the present invention.
Figure 3:
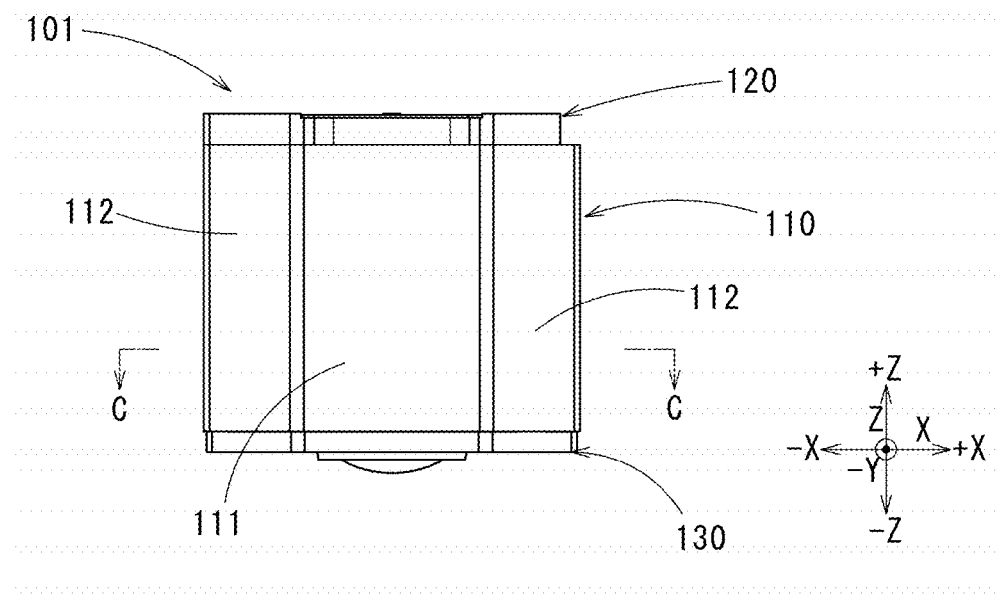
FIG. 3 is a side view showing an optical unit with a shake correction function in accordance with at least an embodiment of the present invention.
Figure 4:
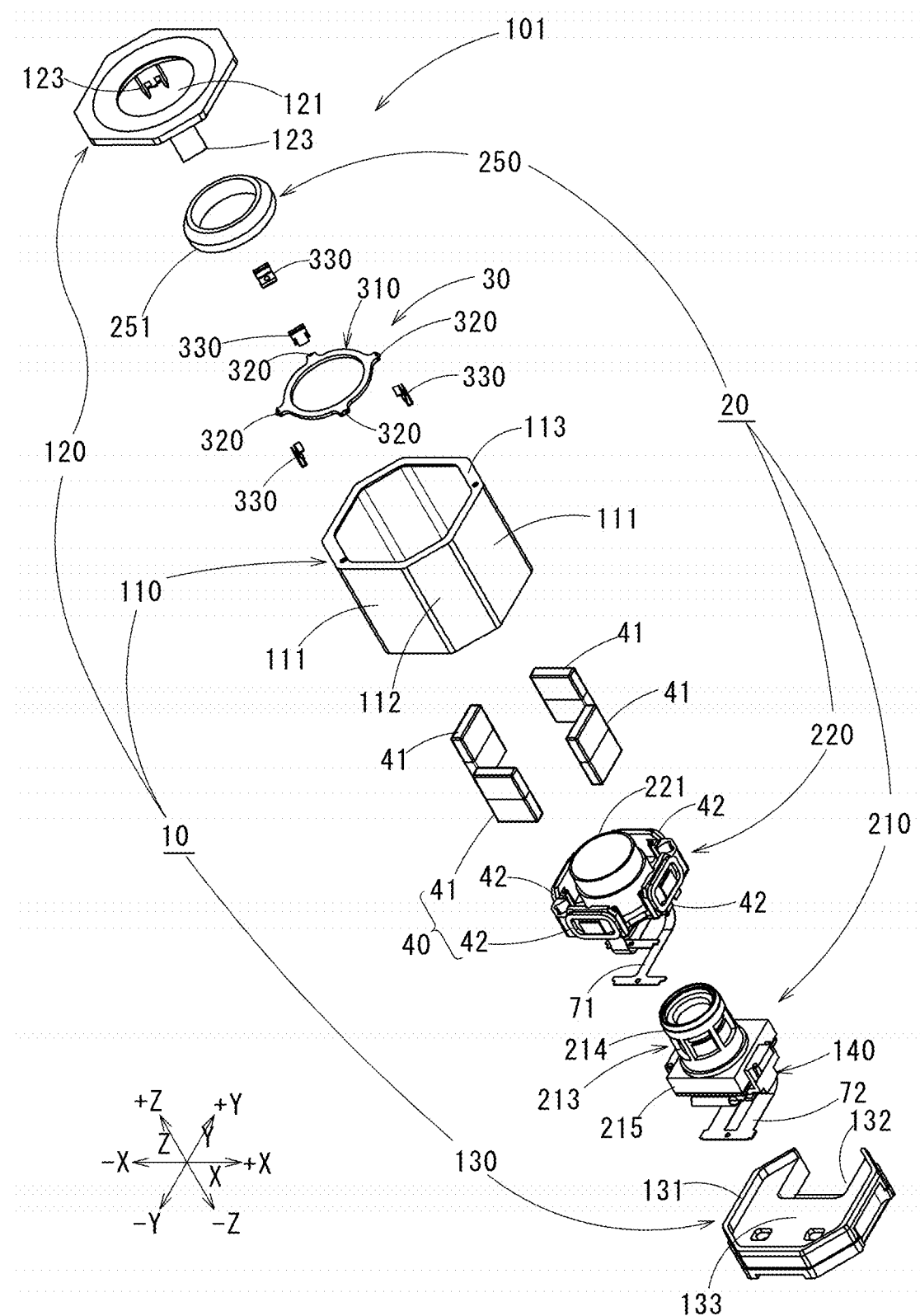
FIG. 4 is an exploded perspective view showing an optical unit with a shake correction function in accordance with at least an embodiment of the present invention.
Figure 5:
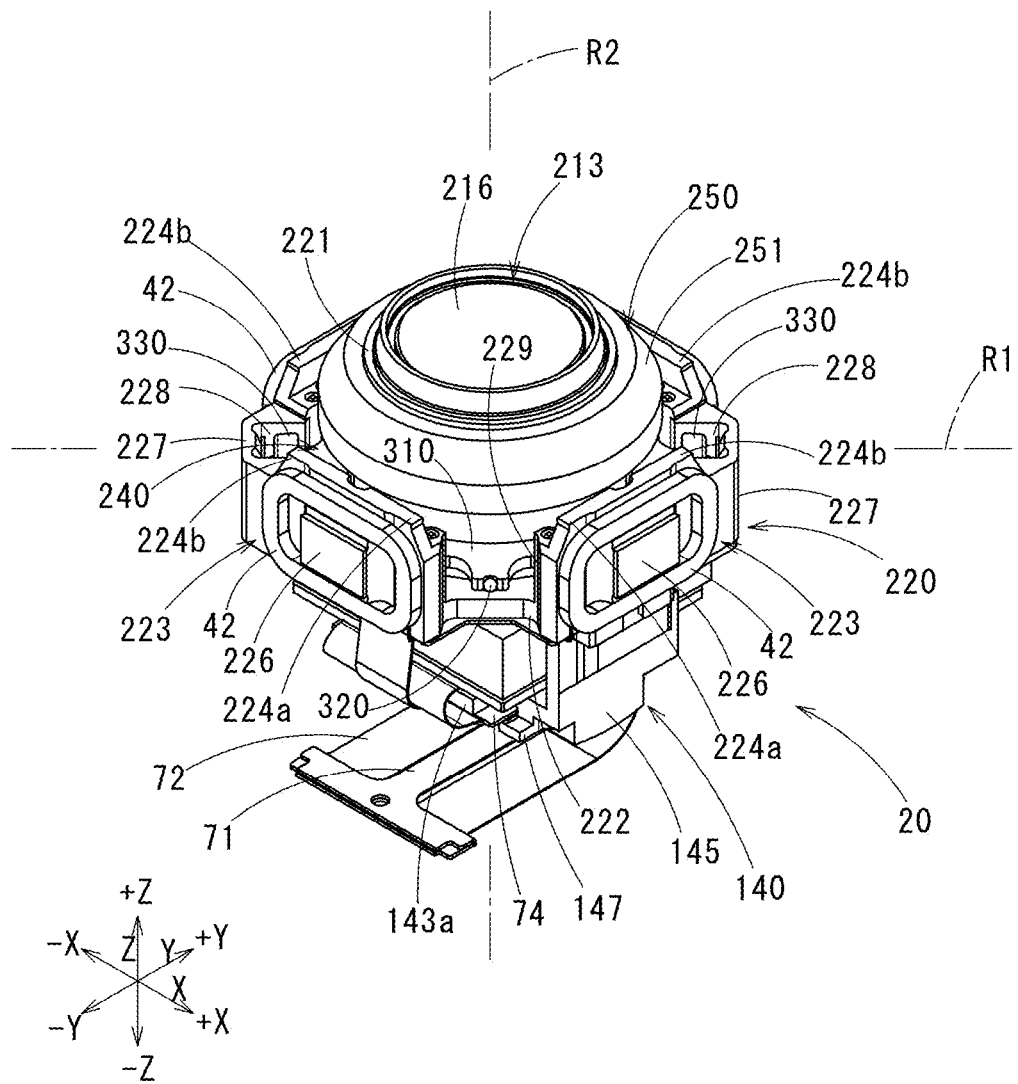
FIG. 5 is a perspective view showing a movable body in an optical unit with a shake correction function in accordance with at least an embodiment of the present invention.
Figure 9:
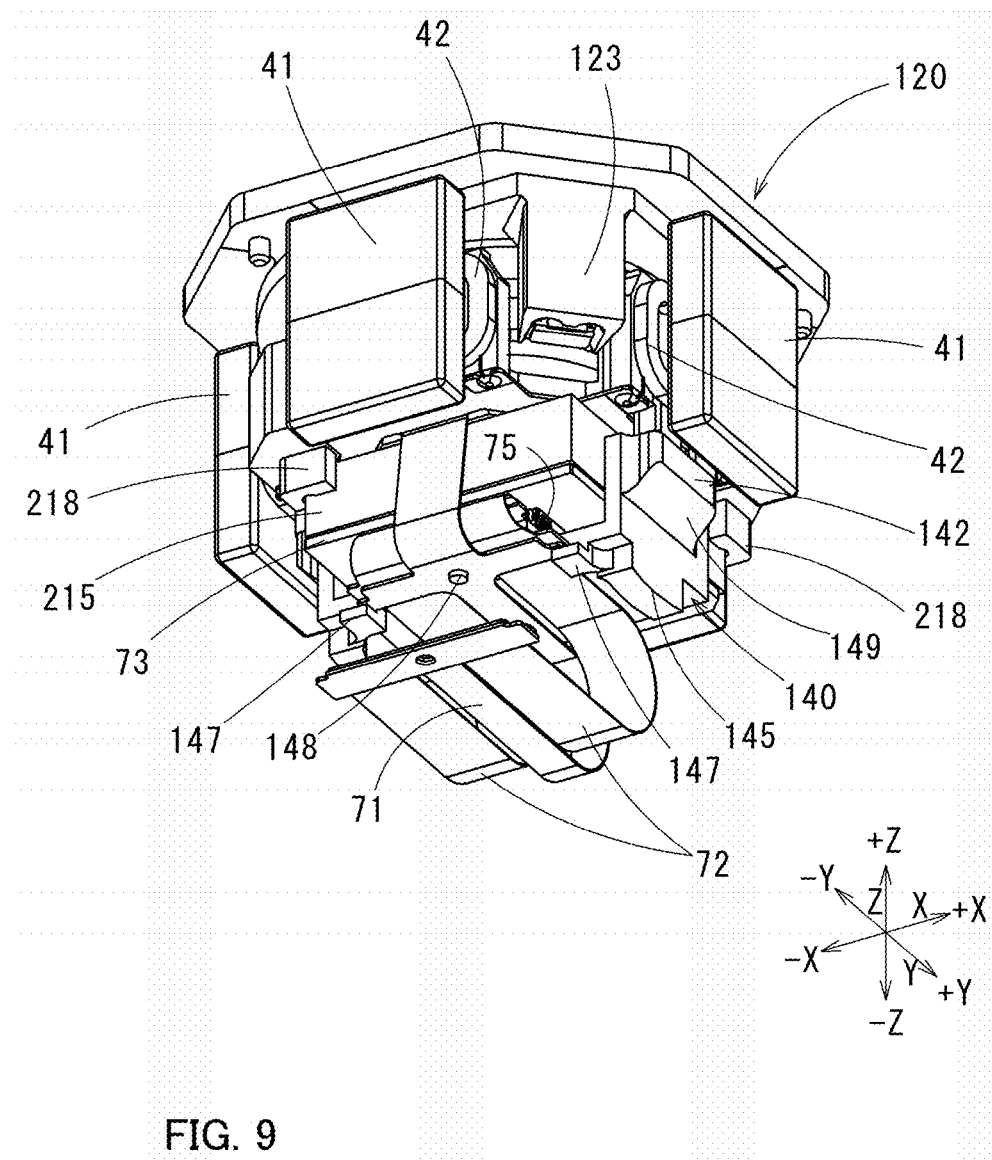
FIG. 9 is a perspective view showing a state of an optical unit with a shake correction function in which a part of a fixed body is not shown and which is viewed from an opposite side to an object to be photographed in accordance with at least an embodiment of the present invention.
Figure 10:
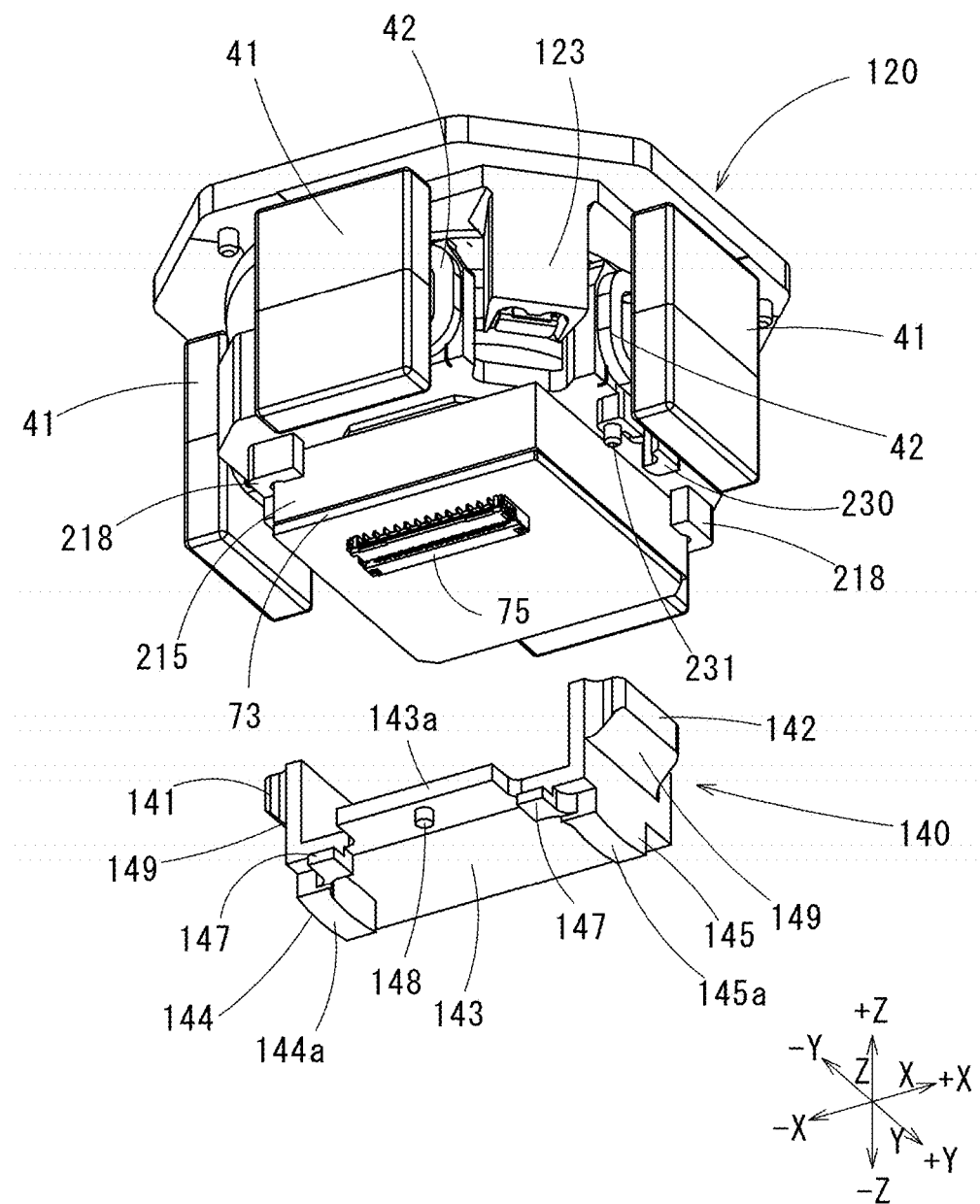
FIG. 10 is a perspective view showing a state that a flexible circuit board is further detached from the state shown in FIG. 9 and a spacer member is separated.
Figure 11:
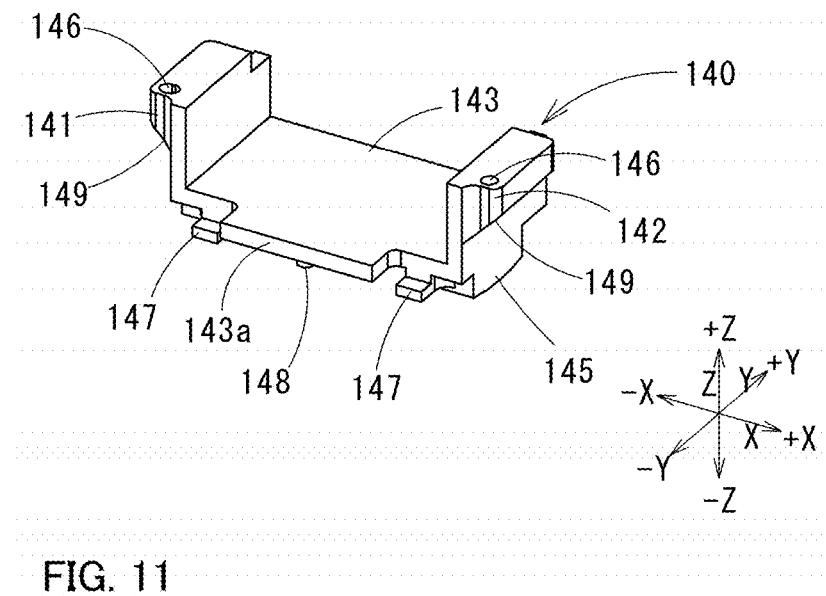
FIG. 11 is a perspective view showing a spacer member which is viewed from an object to be photographed side.
Figure 12:
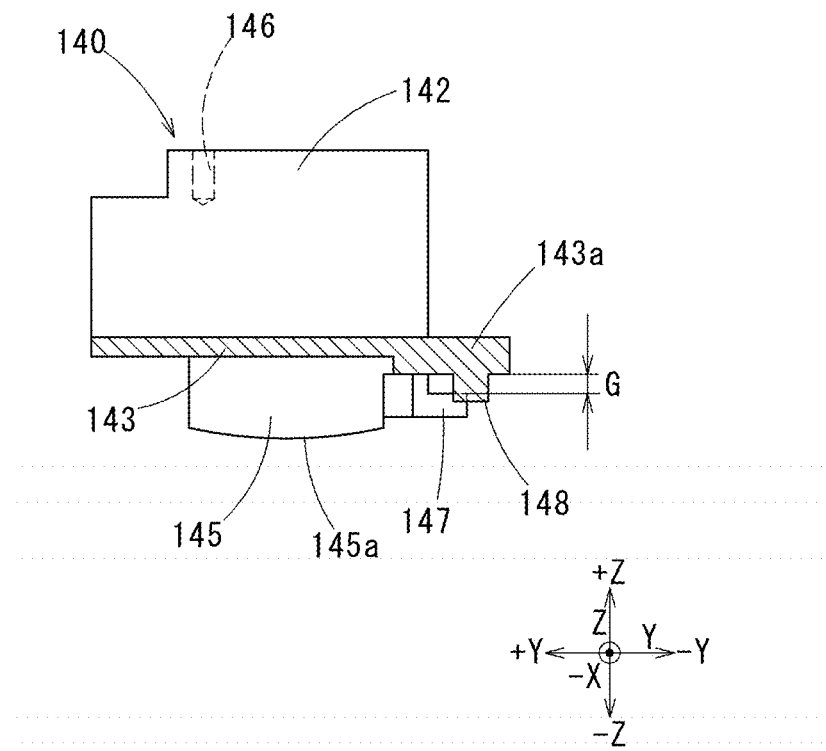
FIG. 12 is a longitudinal cross-sectional view showing a spacer member which is cut along an optical axis.
Figure 13:
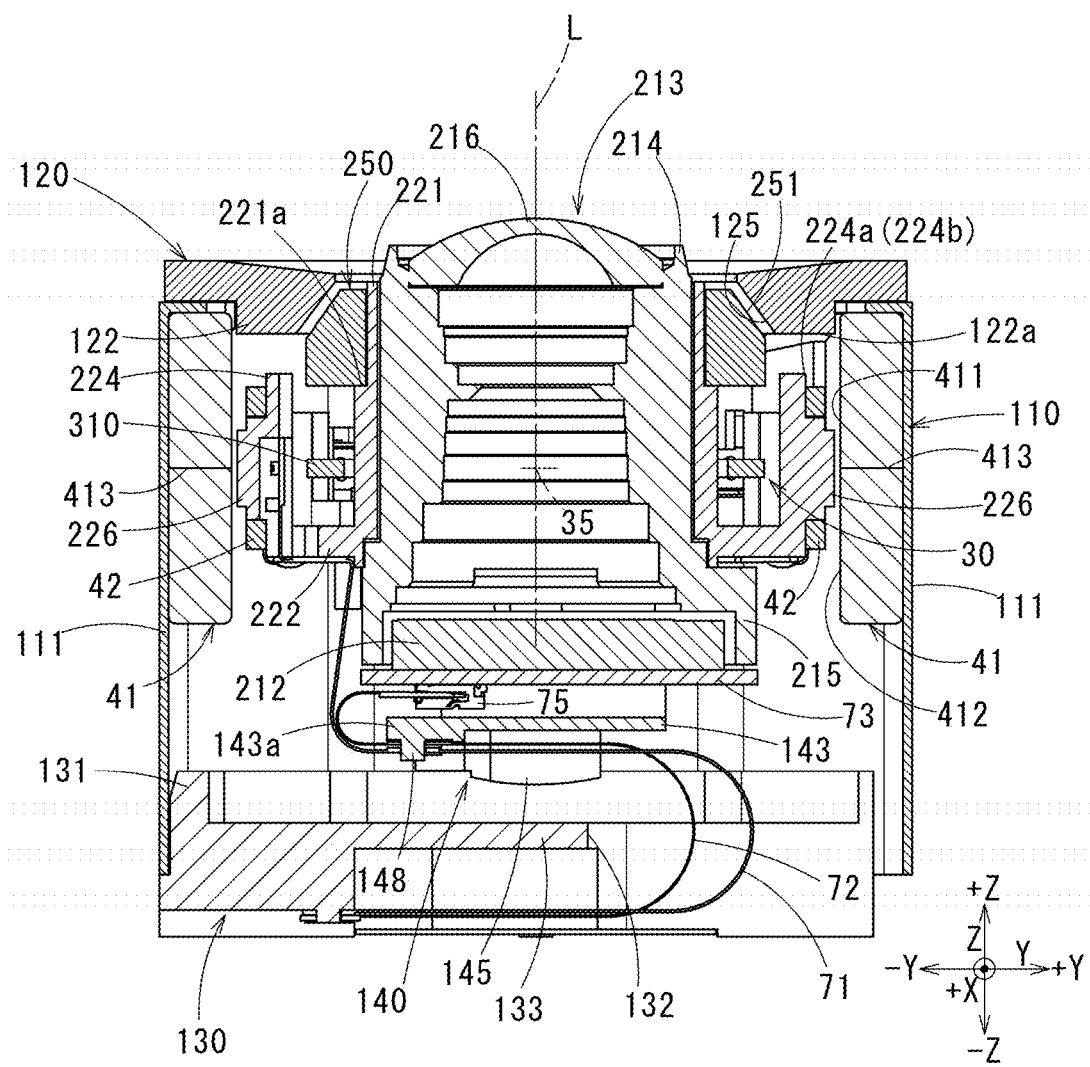
FIG. 13 is a longitudinal cross-sectional view along the "A-A" line in FIG. 2.
Figure 14:
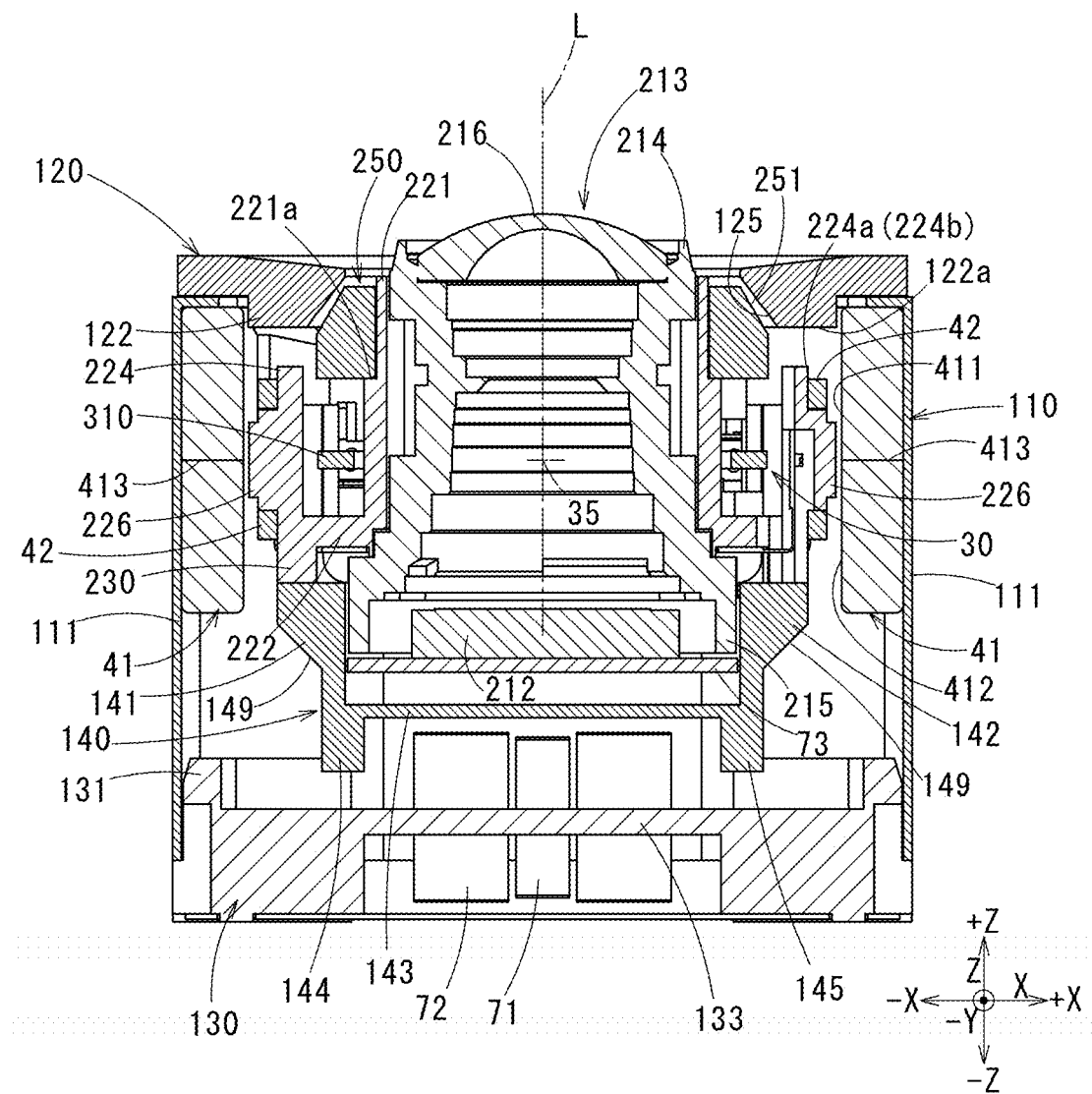
FIG. 14 is a longitudinal cross-sectional view along the "B-B" line in FIG. 2.
Figure 15:
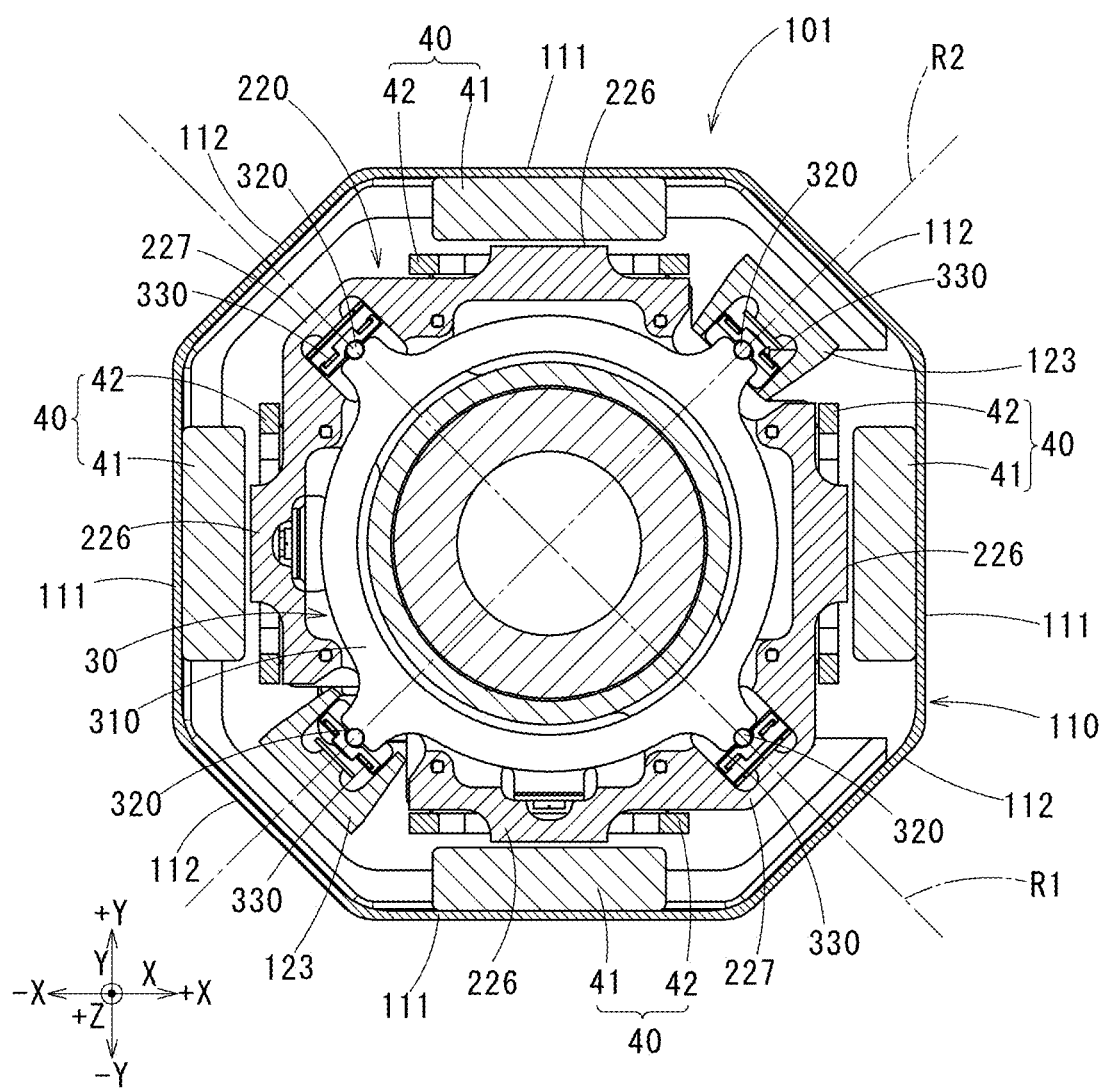
FIG. 15 is a transversal cross-sectional view along the "C-C" line in FIG. 3.

FIG. 1 through FIG. 3 show an outward appearance in an assembled state of an optical unit 101 with a shake correction function (hereinafter, referred to as an optical unit). FIG. 4 shows the optical unit 101 which is exploded along an optical axis "L" direction. FIG. 5 is a perspective view showing a movable body 20 described below of the optical unit 101. FIG. 6 through FIG. 10 are perspective views respectively showing a part of the optical unit 101. FIG. 11 is a perspective view showing a spacer member and FIG. 12 is a longitudinal cross-sectional view showing a spacer member which is cut along an optical axis. FIG. 13 through FIG. 15 are cross-sectional views showing the optical unit 101 viewed from respective directions.

The optical unit 101 shown in these drawings is a thin camera which is incorporated into an optical device (not shown) such as an imaging device which is mounted on a portable terminal, a drive recorder and an unmanned helicopter or the like. The optical unit 101 is mounted in a state supported by a chassis (device main body) of the optical device. In this type of optical unit 101, when a hand shake or the like is occurred in the optical device at a time of photographing, a disturbance occurs in a photographed image. Therefore, the optical unit 101 in this embodiment is structured that a movable body 20 including an optical module (optical element) 210 whose optical axis "L" is extended along the "Z"-axis direction is swung based on a detected result of a shake by a shake detection sensor (not shown) such as a gyroscope to correct pitching and yawing.

In FIG. 1 through FIG. 4, the optical unit 101 in this embodiment includes a fixed body 10, a movable body 20 having an optical module 210, a gimbal mechanism 30 as a swing support mechanism structured to set in a state that the movable body 20 is swingably supported with respect to the fixed body 10, and a shake correction drive mechanism 40 structured to swing the movable body 20. Further, as shown in FIG. 15, the movable body 20 is supported swingably around two axial lines "R1" and "R2" perpendicular to the optical axis "L" direction with respect to the fixed body 10 through the gimbal mechanism 30. One of the two axial lines is referred to as a first axial line "R1" and the other is referred to as a second axial line "R2". The first axial line "R1" and the second axial line "R2" are perpendicular to each other and are disposed at an angle of 45° with respect to the "X"-axis and the "Y"-axis. In the optical unit 101 in this embodiment, the fixed body 10 is formed in an octagonal shape when viewed in the optical axis "L" direction ("+Z" direction).

(Structure of Fixed Body 10)

As shown in FIG. 1 through FIG. 4, the fixed body 10 includes a case 110 in a polygonal tube shape which surrounds around the movable body 20, a cover frame 120 which is fixed to an upper end of the case 110 (one side "+Z" in the "Z"-axis direction), and a bottom cover 130 which is disposed on a lower end of the case 110 (the other end side "−Z" in the "Z"-axis direction). In this embodiment, the case 110 is formed in a polygonal tube shape (tube shape with octagonal transverse cross-section in the example shown in the drawing) by a plurality of side plate parts 111 and 112, and an inward flange 113 is integrally formed at its upper end (one side "+Z" in the "Z"-axis direction).

Figure 7:
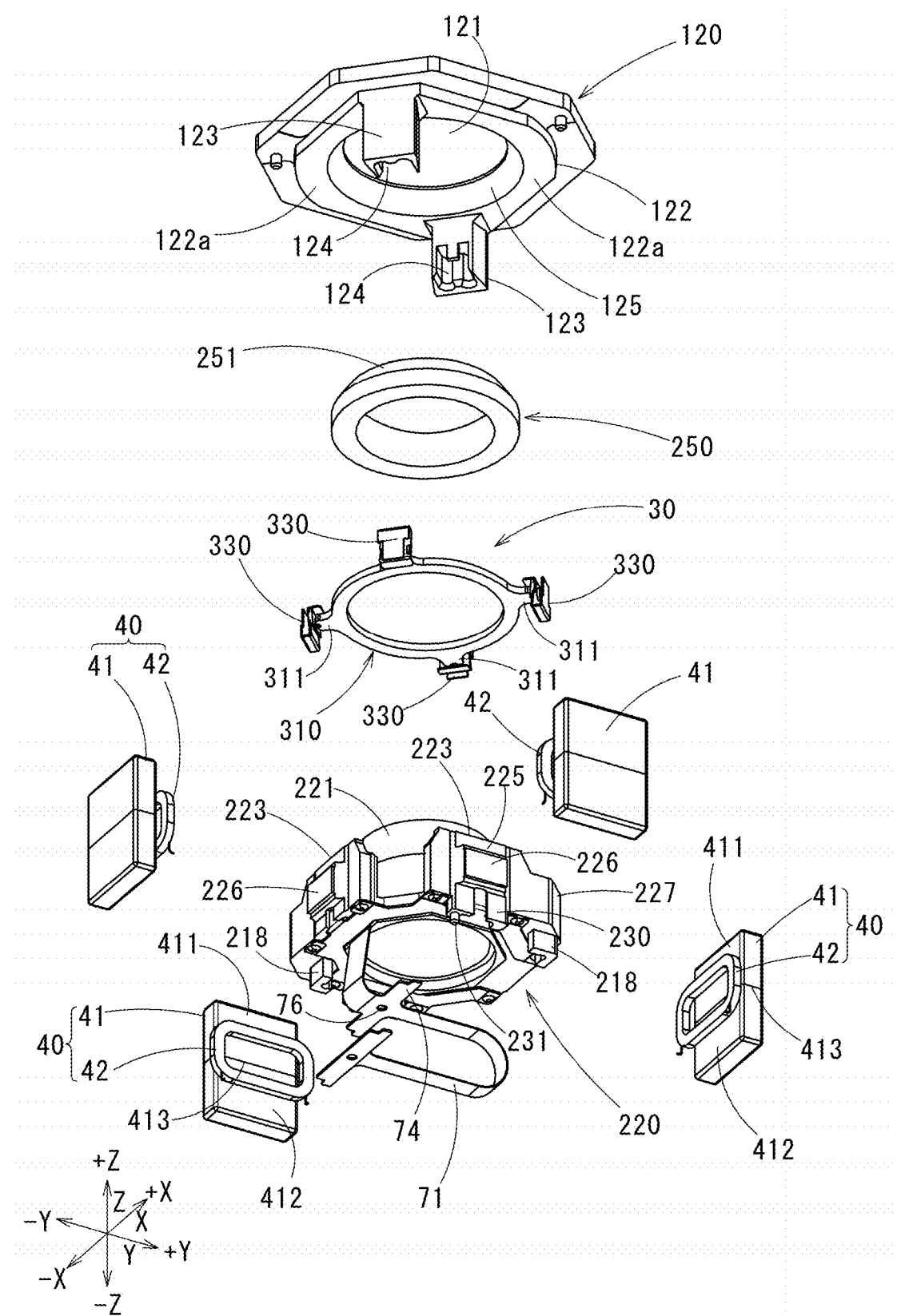
FIG. 7 is an exploded perspective view showing the part of the optical unit with a shake correction function which is viewed from an opposite side to FIG. 6.
Figure 8:
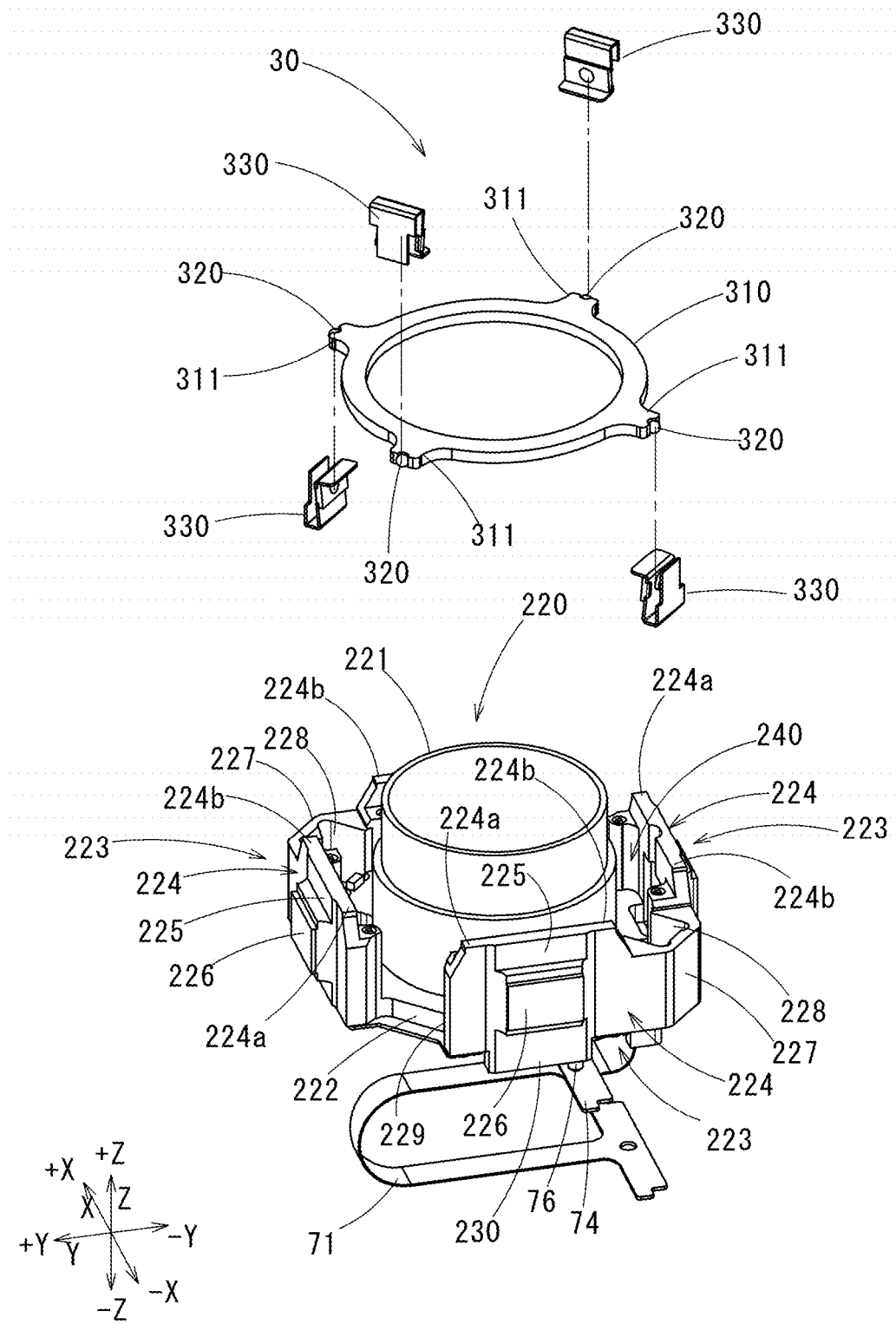
FIG. 8 is a perspective view showing a gimbal mechanism and a holder frame in an optical unit with a shake correction function in accordance with at least an embodiment of the present invention.

An outer shape of the cover frame 120 in a plan view is formed in an octagonal shape along an outer shape of the case 110 and is formed in a polygonal frame shape which is projected to an inner side in a radial direction from an end part of the case 110 on one side "+Z" in the "Z"-axis direction. A center part of the cover frame 120 is formed with a circular opening window 121 through which light from an object to be photographed is led to an optical module 210. Further, as shown in FIG. 7, a protruded part 122 is provided in a ring shape on a rear face of the cover frame 120, in the other words, on the other side "−Z" in the "Z"-axis direction. The protruded part 122 is integrally provided with support plate parts 123 for attaching a contact point spring 330 of a gimbal mechanism 30 described below at positions facing each other at 180°. The support plate parts 123 are protruded to the other side "−Z" in the "Z"-axis direction and are formed with groove parts 124 on opposing faces in the radial direction (direction of 45° with respect to the "X"-axis and the "Y"-axis in the example shown in the drawing).

An outer shape of the bottom cover 130 in a plan view is, as shown in FIG. 4, formed in an octagonal shape along an outer shape of the case 110 and is integrally provided with a peripheral wall part 131 which is fitted to an inner side of the case 110. Further, the bottom cover 130 is formed with a cut-out part 132 for extending flexible circuit boards 71 and 72 for a shake correction drive mechanism 40, an optical module 210 and the like which are disposed inside the case 110 to the outside in a state that the bottom cover 130 is fixed to a lower end of the case 110. The flexible circuit boards 71 and 72 are, as shown in FIG. 13, extended to a rear side of the bottom cover 130 (the other side "−Z" in the "Z"-axis direction) through the cut-out part 132 of the bottom cover 130 and are fixed to a rear face of the bottom cover 130 and electrically connected with a host control part or the like which is provided on a main body side of the optical device.

(Structure of Movable Body 20)

As shown in FIG. 4 and FIG. 5 and the like, the movable body 20 includes an optical module 210 having an optical element such as a lens, a holder frame 220 which holds the optical module 210, and a gravity center adjustment member 230 in a circular ring shape which is fixed to the holder frame 220. The optical module 210 includes, as shown in FIG. 13, a lens holder 213 which holds a lens (not shown), an image pickup element (imaging part) 212, a focusing drive actuator (not shown) and the like and is held by the holder frame 220 through the lens holder 213.

Figure 6:
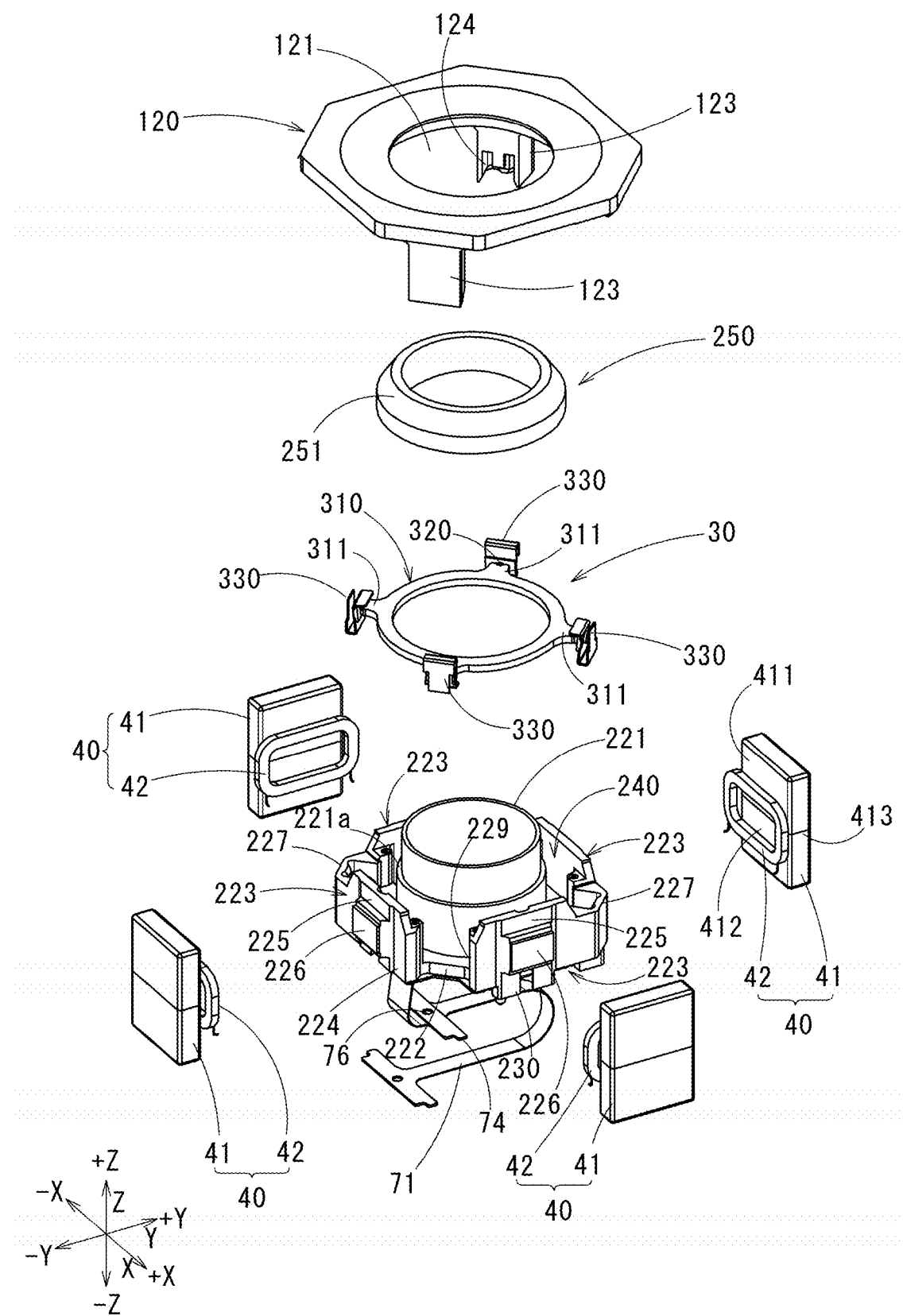
FIG. 6 is an exploded perspective view showing a part of an optical unit with a shake correction function which is viewed from an object side in accordance with at least an embodiment of the present invention.

The lens holder 213 is provided with a lens-barrel part 214 surrounding a lens group, a base part 215 which is integrally formed at a lower end of the lens-barrel part 214 and holds an image pickup element 212 and the like, and a lens cover 216 which covers a front face of the lens-barrel part 214 (face on an object side). The holder frame 220 structures an outer peripheral portion of the movable body 20 as shown in FIG. 5 and FIG. 6 and the like. The holder frame 220 is provided with a holder holding part 221 in a tube shape which holds the lens holder 213 on an inner side, and a base part 222 which is enlarged in a flange shape from a lower end part of the holder holding part 221 (an end part on the other side "−Z" in the "Z"-axis direction). Further, coil holding parts 223 are provided on an outer peripheral part of the base part 222 so that each of the coil holding parts 223 holds each of four coils 42 structuring the shake correction drive mechanism 40 described below on an outer side in the radial direction with respect to the holder holding part 221. A movable frame arrangement space 240 in which a movable frame 310 of the gimbal mechanism 30 described below is disposed is formed between the coil holding parts 223 and the holder holding part 221.

The four coil holding parts 223 are disposed at intervals of 90° around the "Z"-axis and are respectively provided on one side "+X" in the "X"-axis direction and the other side "−X", and on one side "+Y" in the "Y"-axis direction and the other side "−Y". Each of the coil holding parts 223 is provided with a support plate part 224 which is stood up in the "Z"-axis direction from a peripheral edge part of the base part 222, a coil abutting part 225 which is protruded from a part of an outer face of the support plate part 224 and is abutted with a back face of the coil 42 when the coil 42 is held, and a protruded part 226 which is further protruded from the coil abutting part 225 and fitted to an inner side of the coil 42. The support plate part 224 of each of the coil holding parts 223 is disposed so as to be perpendicular to the "X"-axis direction or the "Y"-axis direction and thus, the coil abutting parts 225 and the protruded parts 226 of the outer faces of the respective support plate parts 224 are disposed toward one side "+X" and the other side "−X" in the "X"-axis direction, and toward one side "+Y" and the other side "−Y" in the "Y"-axis direction.

Further, when the ring-shaped coil 42 is attached so as to fit to the protruded part 226 of each of the coil holding parts 223 and a back face of the coil 42 is abutted with the coil abutting part 225, an attaching posture of the coil 42 is restricted. Therefore, the coil 42 is provided on one side "+X" and the other side "−X" in the "X"-axis direction, and on one side "+Y" and the other side "−Y" in the "Y"-axis direction. In this case, the protruded part 226 of each of the coil holding parts 223 is further protruded toward an outer side from an outer face of the coil 42 (face facing a magnet 41 described below) in a state that the coil 42 is held. On the other hand, as described below, magnets 41 provided inside the case 110 of the fixed body 10 face the respective coils 42. Therefore, when the movable body 20 is displaced in the "X"-axis direction or the "Y"-axis direction by an external force, the protruded part 226 of the coil holding part 223 is abutted with the magnet 41 and thus abutting of the coil 42 with the magnet 41 is prevented.

Further, the support plate parts 224 of the two coil holding parts 223 adjacent to each other in a circumferential direction are respectively connected by a connecting part 227. Specifically, the support plate parts 224 of two coil holding parts 223 provided on one side "+X" in the "X"-axis direction and on one side "+Y" in the "Y"-axis direction are set in a connected state by the connecting part 227, and the support plate parts 224 of two coil holding parts 223 provided on the other side "−X" in the "X"-axis direction and on the other side "−Y" in the "Y"-axis direction are set in a connected state by the connecting part 227. As a result, the two connecting parts 227 are diagonally disposed at positions on a line intersecting 45° with respect to the "X"-axis and the "Y"-axis, in other words, disposed at positions opposed by 180° in a direction where the first axial line is extended, and the groove parts 228 are formed on the opposing faces (see FIG. 5 and FIG. 15). On the other hand, the coil holding parts 223 provided on one side "+X" in the "X"-axis direction and on the other side "−Y" in the "Y"-axis direction are separated from each other, and the coil holding parts 223 provided on the other side "−X" in the "X"-axis direction and on one side "+Y" in the "Y"-axis direction are separated from each other. Therefore, open spaces 229 between the coil holding parts 223 are diagonally disposed at positions on a line intersecting 45° with respect to the "X"-axis and the "Y"-axis, in this case, at positions opposed by 180° in a direction where the second axial line is extended. The support plate parts 123 of the cover frame 120 are disposed in the open spaces 229.

Further, the base part 215 of the lens holder 213 is disposed on a lower side ("−Z" side in the "Z"-axis direction) to the holder frame 220, and the lens-barrel part 214 is held by the holder frame 220 in a state that the lens-barrel part 214 is penetrated through the holder holding part 221 of the holder frame 220 and protruded to the "+Z" side in the "Z"-axis direction. The base part 215 is formed in a square shape when viewed from one side in the "Z"-axis direction and, on the other hand, the lens-barrel part 214 is formed in a cylindrical tube shape. Further, the holder holding part 221 of the holder frame 220 is formed in a cylindrical tube shape and the holder frame 220 is provided with two corner holding parts 218 with which two of four corner parts of the base part 215 of the lens holder 213 diagonally disposed at positions opposed by 180° are engaged in a state that the lens-barrel part 214 is fitted to the holder holding part 221 (see FIG. 7). The corner holding part 218 is formed so as to be bent in an "L"-shape when viewed from the other side in the "Z"-axis direction, and a turning of the lens holder 213 around the optical axis is restricted by engaging two diagonally disposed corner parts of the base part 215 of the lens holder 213 with the both corner holding parts 218. Further, a gravity center adjustment member 250 in a ring shape is attached to an upper end part of the tube-shaped holder holding part 221 of the holder frame 220 (end part on one side "+Z" in the "Z"-axis direction) so as to surround the upper end part. The gravity center adjustment member 250 is provided for adjusting a gravity center position of the movable body 20 in the optical axis direction, and the gravity center adjustment member 250 is provided so that the gravity center position of the movable body 20 is coincided with a swing center position 35 described below. In this case, a step part 221a is formed in an outer peripheral part of the holder holding part 221 and the gravity center adjustment member 250 is placed and attached on the step part 221a and fixed by adhesion or the like. In this embodiment, the holder frame 220 is formed of synthetic resin, and the holder holding part 221, the base part 222 and the coil holding parts 223 are integrally formed with each other.

The image pickup element 212, a focusing drive actuator and the like provided on the movable body 20 are connected with a signal output (communication) flexible circuit board 72. The image pickup element 212 is, as shown in FIG. 13 and FIG. 14, connected with a mounted board 73 on which electronic components such as a gyroscope and a capacitor are mounted, and the flexible circuit board 72 described above is connected with the mounted board 73. The base part 215 is formed in an opened state in the "Z"-axis direction, and the mounted board 73 is attached to a lower side of the base part 215 ("−Z" side in the "Z"-axis direction) so as to structure a bottom plate of the base part 215.

The coils 42 structuring the shake correction drive mechanism 40 are connected with the power feeding flexible circuit board 71. The flexible circuit boards 71 and 72 are, as shown in FIG. 13 and FIG. 14 and the like, extended to an outer side after being curved a plurality of times on a lower side (the other side "−Z" in the "Z"-axis direction) with respect to the lens holder 213. As shown in FIG. 5, the flexible circuit board 71 connected with the coils 42 is disposed between two divided portions of the flexible circuit board 72 connected with the optical module 210, and the extended directions of the two flexible circuit boards 71 and 72 to the outside are aligned with each other. Further, each of the flexible circuit boards 71 and 72 has flexibility so that a movement by the shake correction drive mechanism 40 of the holder frame 220 and the optical module 210 held by the holder frame 220 is not disturbed.

(Structure of Shake Correction Drive Mechanism 40)

The shake correction drive mechanism 40 is, as shown in FIG. 4 and FIG. 6 and the like, a magnetic drive mechanism which utilizes plate-shaped magnets 41 and the coils 42 generating electromagnetic forces in magnetic fields of the magnets 41. In this embodiment, a combination of the magnet 41 and the coil 42 is provided at four positions at intervals of 90° in a circumferential direction of the movable body 20 (holder frame 220). Further, as shown in FIG. 13 through FIG. 16, each of the magnets 41 is held by the case 110 and each of the coils 42 is held by the holder frame 220 and, in this embodiment, the shake correction drive mechanism 40 is structured between the case 110 and the holder frame 220.

The magnets 41 are respectively held by inner faces of the four side plate parts 111 which are disposed at intervals of 90° in the circumferential direction of the case 110. The side plate parts 111 are respectively disposed on one side "+X" and the other side "−X" in the "X"-axis direction and on one side "+Y" and the other side "−Y" in the "Y"-axis direction. Therefore, the magnet 41 and the coil 42 are faced each other between the case 110 and the holder frame 220 on each of one side "+X" in the "X"-axis direction, the other side "−X" in the "X"-axis direction, one side "+Y" in the "Y"-axis direction and the other side "−Y" in the "Y"-axis direction.

In this embodiment, each of the four magnets 41 is magnetized so that poles of an outer face side and an inner face side are different from each other. Further, the magnet 41 is magnetized in a two-divided state in the optical axis "L" direction ("Z"-axis direction), and magnetic poles 411 and 412 located on the coil 42 side (inner face side) are magnetized different from each other in the optical axis "L" direction (see FIG. 6, FIG. 7, FIG. 13 and FIG. 14). Therefore, a magnetized polarizing line 413 which divides the magnetic poles 411 and 412 is disposed along a direction perpendicular to the optical axis "L". The magnetized polarizing line 413 of each of the two magnets 41 respectively disposed on one side "+X" in the "X"-axis direction and on the other side "−X" in the "X"-axis direction is disposed along the "Y"-axis direction, and the magnetized polarizing line 413 of each of the two magnets 41 disposed on one side "+Y" in the "Y"-axis direction and on the other side "−Y" in the "Y"-axis direction is disposed along the "X"-axis direction. In this embodiment, magnetized patterns of an outer face side and an inner face side in the four magnets 41 are the same as each other. Therefore, the magnets 41 adjacent to each other in the circumferential direction are not attracted to each other and thus, assembling and the like are easily performed. Further, the case 110 is made of magnetic material and functions as a yoke for the magnets 41.

The coil 42 is an air core coil which does not have a core and, as described above, the coil 42 is held on one side "+X" in the "X"-axis direction, the other side "−X" in the "X"-axis direction, one side "+Y" in the "Y"-axis direction and the other side "−Y" in the "Y"-axis direction of the holder frame 220. In the four coils 42, the both coils 42 disposed on one side "+X" in the "X"-axis direction and the other side "−X" in the "X"-axis direction of the holder frame 220 are formed by a winding wire in a ring shape with the "X"-axis direction as an axial center direction of the coil. Further, the both coils 42 disposed on one side "+Y" in the "Y"-axis direction and the other side "−Y" in the "Y"-axis direction are formed by a winding wire in a ring shape with the "Y"-axis direction as an axial center direction of the coil. Therefore, each of the coils 42 is formed in a ring shape with a direction perpendicular to the optical axis "L" direction as an axial center direction of the coil. Further, the four coils 42 are formed in the same planar shape and have the same thickness (height) dimension.

In the four coils 42, two coils 42 whose axial center directions are the "X"-axis direction are formed in a rectangular shape which is extended in the "Y"-axis direction. Further, two coils 42 whose axial center directions are the "Y"-axis direction are formed in a rectangular shape which is extended in the "X"-axis direction. Further, long side parts disposed on an upper side and a lower side of each coil 42 are utilized as effective sides facing the magnetic poles 411 and 412 of each magnet 41 and, in a state that the coil 42 is not excited, both effective sides are disposed parallel to the magnetized polarizing line 413 of the facing magnet 41 at positions separated from the magnetized polarizing line 413 by the same distance in the upper and lower direction (see FIG. 6 and FIG. 7).

(Structure of Gimbal Mechanism 30)

In the optical unit 101 in this embodiment, in order to correct shakes in a pitching direction and a yawing direction, the movable body 20 is swingably supported around the first axial line "R1" intersecting the optical axis "L" direction and swingably supported around the second axial line "R2" intersecting the optical axis "L" direction and the first axial line "R1". Therefore, a gimbal mechanism (swing support mechanism) 30 is structured between the fixed body 10 and the movable body 20. In this embodiment, the gimbal mechanism 30 includes a movable frame 310 in a circular ring shape. The movable frame 310 is, as shown in FIG. 5 and the like, disposed in the movable frame arrangement space 240 of the holder frame 220 and, when viewed in the "Z"-axis direction, the movable frame 310 is disposed between an under face (face on the other side "−Z" in the "Z"-axis direction) of the cover frame 120 of the fixed body 10 and an upper face (face on one side "+Z" in the "Z"-axis direction) of the base part 222 of the holder frame 220 of the movable body 20.

In this embodiment, the movable frame 310 is made of metal material and the like having a spring property and is integrally formed with protruding parts 311 at four positions at intervals of 90° in the circumferential direction so as to protrude to outer sides in the radial direction with respect to the center of the ring-shaped movable frame 310. Each of the protruding parts 311 is fixed with a spherical body 320 by welding or the like so that a convex surface in a hemispherical shape is further protruded to an outer side in the radial direction. In the movable frame 310, two of the four spherical bodies 320 diagonally located are disposed in a direction where the first axial line "R1" described above is extended, and the two spherical bodies 320 diagonally located at other angles are disposed in a direction where the second axial line "R2" is extended. Further, the two spherical bodies 320 disposed in the extending direction of the first axial line "R1" are supported by contact point springs 330 provided in the holder frame 220, and the two spherical bodies 320 disposed in the extending direction of the second axial line "R2" are supported by contact point springs 330 fixed to the cover frame 120.

On the upper face of the base part 222 of the holder frame 220, as shown in FIG. 5, the groove part 228 which is opened toward one side "+Z" in the "Z"-axis direction is formed in each of the two connecting parts 227 diagonally located in the direction where the first axial line "R1" is extended. The contact point springs 330 are respectively attached to the respective groove parts 228, and the two spherical bodies 320 diagonally located in the direction where the first axial line "R1" is extended are respectively supported by the contact point springs 330. On the other hand, the rear face of the cover frame 120 is formed with a pair of the support plate parts 123 at diagonal positions opposing each other at 180° so as to protrude toward the "−Z" in the "Z"-axis direction, and the contact point spring 330 is attached to an inside of the groove part 124 on an inner side of each of the support plate parts 123. Further, the support plate parts 123 of the cover frame 120 are disposed in the open spaces 229 between the coil holding parts 223 of the holder frame 220 and thereby the contact point spring 330 is disposed at two positions diagonally located in the direction where the second axial line "R2" is extended, and two spherical bodies 320 are respectively supported by the contact point springs 330 at positions diagonally located in the direction where the second axial line "R2" is extended.

Each of the contact point springs 330 is formed in a bent shape by press-forming an elastically deformable plate member made of metal such as stainless steel so as to be in a "U"-shape in longitudinal cross section. The contact point spring 330 applies an elastic load (elastic force) to a contact point with the spherical body 320 provided in the movable frame 310 toward an inner side from an outer side in the radial direction. In other words, each of the spherical bodies 320 provided in the four protruding parts 311 of the movable frame 310 is elastically contacted with each of the contact point springs 330 attached to the cover frame 120 of the fixed body 10 or the holder frame 220 of the movable body 20 from an outer side in the radial direction.

In this case, as shown in FIG. 15, the contact point springs 330 fixed to the holder frame 220 face each other so as to be paired in the first axial line "R1" direction and structure a first swing support point together with the spherical bodies 320 of the movable frame 310. On the other hand, the contact point springs 330 fixed to the cover frame 120 face each other so as to be paired in the second axial line "R2" direction and structure a second swing support point together with the spherical bodies 320 of the movable frame 310. Therefore, a swing center position (swing support point) 35 of the movable body 20 is disposed at an intersection point of the first axial line "R1" with the second axial line "R2" which is obtained by combining the first swing support points with the second swing support points.

As described above, each of the spherical bodies 320 of the movable frame 310 is swingably contacted with the contact point spring 330 and thus, the holder frame 220 of the movable body 20 is swingably supported by the cover frame 120 of the fixed body 10. Further, in the gimbal mechanism 30 structured as described above, urging forces of the respective contact point springs 330 are set to be equal to each other. In this embodiment, the magnetic drive mechanism is used in the shake correction drive mechanism 40 and thus both of the movable frame 310 and the contact point springs 330 used in the gimbal mechanism 30 are made of nonmagnetic material.

Further, in this embodiment, the movable frame 310 is disposed at a position so that, when viewed in a direction perpendicular to the optical axis "L" direction, the gimbal mechanism 30 is overlapped with the shake correction drive mechanism 40. Especially, in this embodiment, as shown in FIG. 13 and FIG. 14, when viewed in a direction perpendicular to the optical axis "L" direction, the gimbal mechanism 30 is disposed at a position overlapping with the center position in the "Z"-axis direction of the shake correction drive mechanism 40. More specifically, in a non-excitation state of the shake correction drive mechanism 40, the gimbal mechanism 30 is provided at the same height position as the magnetized polarizing lines 413 of the magnets 41 in the "Z"-axis direction. Therefore, the first swing support points and the second swing support points of the gimbal mechanism 30 are disposed at a position overlapping with the center position of the shake correction drive mechanism 40 in the "Z"-axis direction, and the swing center position 35 of the movable body 20 is also disposed at a position overlapping with the center position of the shake correction drive mechanism 40.

(Swing Allowable Range and Restriction Mechanism of Movable Range in Optical Axis Direction)

As described above, in the optical unit 101 in this embodiment, the movable body 20 is capable of swinging with the swing center position 35 as a center and, since the movable frame 310 of the gimbal mechanism 30 is formed of elastic material, the movable body 20 is also movable in the optical axis direction in an elastically deformable region. Further, a mechanism for restricting an allowable range of the swing or the movement in the optical axis direction of the movable body 20 is provided.

Swing Allowable Range Restriction Mechanism

In each of the coil holding parts 223 of the holder frame 220 of the movable body 20, the support plate part 224 is formed in a size protruding to one side "+Z" in the "Z"-axis direction with respect to the coil 42 in a state that the coil 42 is mounted on the support plate part 224. The protruding end part is formed along an extending direction of the support plate part 224, and corner parts 224a and 224b at both ends of the protruding end part are structured so as to be abutted with a surface 122a of the protruded part 122 of the cover frame 120 at a maximum position in the swing allowable range. In this case, since four support plate parts 224 are provided, in a plan view when viewed from the "+Z" side in the "Z"-axis direction, totaled eight corner parts 224a and 224b are disposed, i.e., four on the right and left sides across the first axial line "R1" and four on the right and left sides across the second axial line "R2". Positions in the "Z"-axis direction of the respective corner parts 224a and 224b are set to be equal to each other.

Further, two of the four support plate parts 224 are respectively connected with each other by the connecting part 227 and the four support plate parts 224 are formed in an arrangement of 45° with respect to the first axial line "R1" in a direction where both the connecting parts 227 are connected and with respect to the second axial line "R2" in a direction perpendicular to the first axial line "R1". Therefore, as shown in FIG. 5, in the four corner parts 224a and 224b which are disposed on each of the right side and the left side across the first axial line "R1", when two corner parts disposed at positions farther from the first axial line "R1" are indicated by the reference sign 224a and two corner parts disposed at positions farther from the second axial line "R2" are indicated by the reference sign 224b, distances from the first axial line "R1" of the two corner parts 224a disposed at the positions farther from the first axial line "R1" are set equal to each other, and distances from the second axial line "R2" of the two corner parts 224b disposed at positions farther from the second axial line "R2" are set equal to each other.

Further, at a maximum position of the swing allowable range, the two corner parts 224a disposed at positions farther from the first axial line "R1" are abutted with the surface 122a of the protruded part 122 of the cover frame 120 for a swing around the first axial line "R1", and the two corner parts 224b disposed at positions farther from the second axial line "R2" are abutted with the surface 122a of the protruded part 122 of the cover frame 120 for a swing around the second axial line "R2". In other words, the surface 122a of the protruded part 122 of the cover frame 120 (face on the other "−Z" side in the "Z"-axis direction) is abutted with the corner parts 224a and 224b of the support plate part 224 in a maximum swing range to restrict a further swing. In other words, the eight corner parts 224a and 224b of the four support plate parts 224 and the surface 122a of the protruded part 122 of the cover frame 120 structure a swing allowable range restriction mechanism.

Optical Axis Direction Movable Range Restriction Mechanism

An optical axis direction movable range restriction mechanism structured to restrict a movable range in the optical axis direction of the movable body 20 includes a stopper mechanism for a movement to an object side and a stopper mechanism for a movement to an opposite side to the object side.

a. Stopper Mechanism For Movement to Object Side

A gravity center adjustment member 250 in a ring shape is provided at an upper end part of the holder holding part 221 of the holder frame 220 (end part on one side "+Z" in the "Z"-axis direction). A longitudinal cross section along the "Z"-axis direction of the gravity center adjustment member 250 is, as shown in FIG. 13 and FIG. 14, formed in a pentagonal shape, and an inclined face 251 is formed on one side "+Z" in the "Z"-axis direction so that the thickness in the "Z"-axis direction is gradually reduced as going to an outer side in the radial direction, in other words, so that the inclined face 251 is inclined in a direction approaching the optical axis "L" as going to an object side along the optical axis direction. Further, an inner peripheral part of the cover frame 120 of the fixed body 10 is projected to an inner side in the radial direction with respect to an outer peripheral face of the gravity center adjustment member 250. An inclined face 125 is formed on a rear face side of the inner peripheral part, in other words, on the other side "−Z" in the "Z"-axis direction so that a thickness in the "Z"-axis direction becomes gradually larger as going to an outer side in the radial direction (so that the inclined face 125 is inclined in a direction approaching the optical axis "L" as going to an object side along the optical axis direction). Further, the inclined face 251 of the gravity center adjustment member 250 and the inclined face 125 of the cover frame 120 are faced each other and a gap space having a constant width is formed between the inclined face 251 and the inclined face 125. Further, when the movable body 20 including the gravity center adjustment member 250 is moved to one side "+Z" in the "Z"-axis direction (optical axis direction) by an external force, the inclined face 251 of the gravity center adjustment member 250 is abutted with the inclined face 125 of the cover frame 120 to restrict further movement. In other words, a stopper mechanism is structured of the inclined face 251 of the gravity center adjustment member 250 and the inclined face 125 of the cover frame 120 when the movable body 20 is moved to an object side in the optical axis direction.

In this case, a separated distance "H1" in the "Z"-axis direction (optical axis direction) of the gap space between the inclined face 125 of the cover frame 120 and the inclined face 251 of the gravity center adjustment member 250 is set to be smaller than a separated distance "H2" in the "Z"-axis direction (optical axis direction) between the corner parts 224a and 224b of the support plate part 224 of the holder frame 220 described above and the protruded part 122 of the cover frame 120. Therefore, when the movable body 20 is moved in the "Z"-axis direction by a predetermined amount or more, the inclined face 125 of the cover frame 120 and the inclined face 251 of the gravity center adjustment member 250 are abutted with each other without causing the corner parts 224a and 224b of the support plate part 224 of the holder frame 220 to abut with the protruded part 122 of the cover frame 120. Further, the inclined face 125 of the cover frame 120 and the inclined face 251 of the gravity center adjustment member 250 are formed in inclined shapes substantially along a tangential direction at the time of swinging and, in addition, the separated distance "H1", sizes of opposing faces of both the inclined faces 125 and 251 and the like are set so as not to obstruct a swing of the movable body 20 and, even at a maximum position in the swing allowable range of the movable body 20, their dimensions are set so that both the inclined faces 251 and 125 are not contacted with each other.

b. Stopper Mechanism For Movement on Opposite Side to Object Side

As shown in FIG. 13 and FIG. 14, a spacer member 140 which is extended from the base part 215 of the lens holder 213 to a lower side (the other side "−Z" in the "Z"-axis direction) is provided on the other side "−Z" in the "Z"-axis direction of the holder frame 220. The spacer member 140 is structured so that, as shown in FIG. 10 and FIG. 11, a pair of support parts 141 and 142 are provided on one side "+Z" in the "Z"-axis direction, a bridge part 143 is integrally formed so as to connect the support parts 141 and 142 with each other on the other side "−Z" in the "Z"-axis direction, and a pair of stopper protruded parts 144 and 145 are provided on the other side "−Z" in the "Z"-axis direction with respect to the bridge part 143 so that parts of the support parts 141 and 142 are respectively extended to the other side "−Z" in the "Z"-axis direction. In this case, the base part 215 of the lens holder 213 is disposed so as to protrude to the other side "−Z" in the "Z"-axis direction from a lower end of the holder frame 220, and the support parts 141 and 142 of the spacer member 140 are formed in a length further projecting to the other side "−Z" in the "Z"-axis direction with respect to the base part 215 protruded from the holder frame 220.

Faces on one side "+Z" in the "Z"-axis direction of both support parts 141 and 142 of the spacer member 140 are fixed to faces on the other side "−Z" in the "Z"-axis direction of the holder frame 220 in an abutted state on an outer side of the base part 215 of the lens holder 213 and thereby the spacer member 140 is attached to the holder frame 220 so as to straddle over the base part 215 of the lens holder 213 on the other side "−Z" in the "Z"-axis direction. Specifically, in the embodiment shown in FIG. 6 and the like, attaching parts 230 are integrally formed in the holder frame 220 on a lower side of the coil holding parts 223 located at the positions opposed at 180° in the "X"-axis direction on the other side "−Z" in the "Z"-axis direction. A lower end face of the attaching part 230 is formed in a flat face perpendicular to the "Z"-axis direction and a pin 231 projecting toward the other side "−Z" in the "Z"-axis direction is formed on the lower end face. On the other hand, upper end faces of both the support parts 141 and 142 of the spacer member 140 are formed in a flat face perpendicular to the "Z"-axis direction, and the upper end face is formed with a hole part 146 into which the pin 231 of the holder frame 220 is fitted. The upper end faces of the support parts 141 and 142 of the spacer member 140 are abutted with the lower end faces of the attaching parts 230 of the holder frame 220 and the spacer member 140 is fixed to the holder frame 220 in a state that the pin 231 is fitted into the hole 146. In this fixed state, the bridge part 143 connects both the support parts 141 and 142 on a lower side with respect to the base part 215 ("−Z" side in the "Z"-axis direction).

The stopper protruded parts 144 and 145 of the spacer member 140 are comprised of a first protruded part 144 and a second protruded part 145 which are disposed on both ends of the bridge part 143. The first protruded part 144 and the second protruded part 145 are respectively formed in a plate shape along the "Y"-axis direction which is perpendicular to the plate-shaped bridge part 143, and their lower ends are disposed on the most other side "−Z" in the "Z"-axis direction of the spacer member 140 and face an upper face of the bottom cover 130. Further, when the movable body 20 is moved toward the other side "−Z" in the "Z"-axis direction, the first protruded part 144 and the second protruded part 145 are abutted with the bottom plate part 133 of the bottom cover 130 and further movement is restricted. In other words, in this embodiment, the bottom plate part 133 of the bottom cover 130 is a stopper member in at least an embodiment of the present invention, and a stopper mechanism for movement to an opposite side to the object side in the optical axis direction is structured of the stopper protruded parts 144 and 145 of the spacer member 140 and the bottom plate part 133 of the bottom cover 130.

The first protruded part 144 and the second protruded part 145 of the stopper protruded parts are, as shown in FIG. 14, disposed on an outer side with respect to the image pickup element 212 and, therefore, they are disposed so as not to overlap with the image pickup element 212 when viewed in the "Z"-axis direction (optical axis direction). Further, the lower end faces of the first protruded part 144 and the second protruded part 145 facing the bottom cover 130 are formed in a circular arc shape with the swing center position 35 as a center when viewed in a direction perpendicular to the optical axis direction (when viewed in the "X"-axis direction in the embodiment shown in FIG. 12 and FIG. 13), and the first protruded part 144 and the second protruded part 145 are formed so that the circular arc faces 144a and 145a are not contacted with the bottom plate part 133 of the bottom cover 130 and do not disturb swinging when the movable body 20 is swung around the "X"-axis. In this case, a sufficient gap space is formed between the protruded parts 144 and 145 and the bottom plate part 133 so that the first protruded part 144 and the second protruded part 145 are not abutted with the bottom plate part 133 of the bottom cover 130 when the movable body 20 is swung around the "Y"-axis. Further, both the support parts 141 and 142 of the spacer member 140 are attached to the attaching parts 230 at a lower end of the holder frame 220 and, as shown in FIG. 9 and the like, the support parts 141 and 142 are disposed in the vicinity of the magnets 41 of the shake correction drive mechanism 40. Therefore, in order to prevent the support parts 141 and 142 from contacting with the magnet 41 at a time of a swing, chamfer parts 149 which are obliquely cut off are formed on outer side faces of lower portions of the support parts 141 and 142 abutted with the holder frame 220.

(Support Structure of Flexible Circuit Board)

The bridge part 143 of the spacer member 140 is formed in a plate shape and is disposed in parallel to the mounted board 73 on a lower side ("−Z" side in the "Z"-axis direction) with respect to the mounted board 73 which structures the bottom plate of the base part 215. A connector 75 connected with the image pickup element 212 and the like are provided on an under face of the mounted board 73, and the flexible circuit board 72 is connected with the connector 75. Further, a protruded plate part 143a which is protruded so that a center part in a width direction of the bridge part 143 excepting both end parts in the width direction is extended to the other side "−Y" in the "Y"-axis direction is integrally formed in the bridge part 413 on the other side "−Y" in the "Y"-axis direction.

Circuit board receiving parts 147 are provided on an under face (face on the other side "−Z" in the "Z"-axis direction) of the bridge part 143 of the spacer member 140 for holding midway positions of the flexible circuit board 71 extended from the under face of the holder frame 220 and the flexible circuit board 72 extended from the mounted board 73 between the protruded plate part 143a of the bridge part 143 and the circuit board receiving parts 147. The circuit board receiving parts 147 are formed at a lower side position with respect to both the end parts in the width direction of the bridge part 143 so as to protrude in a plate shape from both the stopper protruded parts 144 and 145 toward the other side "−Y" in the "Y"-axis direction.

Both the flexible circuit boards 71 and 72 are formed with wide width parts 74 which are reinforced by plates at a midway position. On the other hand, the circuit board receiving parts 147 and the protruded plate part 143a of the bridge part 143 are arranged so as not to overlap with each other in the "Z"-axis direction (optical axis direction). In this case, a separated distance "G" in the "Z"-axis direction (see FIG. 12) between an upper face of the circuit board receiving part 147 and an under face of the protruded plate part 143a of the bridge part 143 is set to be a dimension slightly larger than a thickness of the overlapped wide width parts 74 of both the flexible circuit boards 71 and 72.

The center parts in the width direction of both the flexible circuit boards 71 and 72 are disposed on a lower side of the protruded plate part 143a in a state that the wide width parts 74 are overlapped with each other, and both the end parts in the width direction are supported by upper faces of the circuit board receiving parts 147 in a placed state. Both the flexible circuit boards 71 and 72 are supported between the under face of the protruded plate part 143a and the upper faces of the circuit board receiving parts 147 and then extended along the under face of the bridge part 143.

A circuit board engaging part 148 in a pin shape which is protruded toward the other side "−Z" in the "Z"-axis direction is formed in a center part on the under face of the protruded plate part 143a of the bridge part 143. Further, center parts in the wide width parts 74 of both the flexible circuit boards 71 and 72 are formed with through-holes 76 into which the circuit board engaging part 148 is inserted. When the circuit board engaging part 148 is inserted into the through-holes 76, movements are restricted in plane directions ("X"-axis direction and "Y"-axis direction) of both the flexible circuit boards 71 and 72 which are supported between the under face of the protruded plate part 143a and the upper faces of the circuit board receiving parts 147. In other words, both the end parts in the width direction of the wide width parts 74 of both the flexible circuit boards 71 and 72 are placed on the upper faces of the circuit board receiving parts 147, and the circuit board engaging part 148 is inserted into the through-holes 76 of the wide width parts 74. As a result, the center parts in the width direction of the wide width parts 74 are set in an abutted state with the under face of the protruded plate part 143a of the bridge part 143 and then both the flexible circuit boards 71 and 72 are extended along the under face of the bridge part 143. In this embodiment, the circuit board holding part in accordance with at least an embodiment of the present invention is structured of the circuit board receiving parts 147, the protruded plate part 143a, and the circuit board engaging part 148.

As described above, both the flexible circuit boards 71 and 72 are disposed between the stopper protruded parts 144 and 145 of the spacer member 140. Therefore, both the flexible circuit boards 71 and 72 are sandwiched between the movable body 20 and the fixed body 10 and thus they are not damaged when the movable body 20 is moved (swinging or movement in the optical axis direction). The flexible circuit boards 71 and 72 are, as described above, extended outside through the cut-out part 132 of the bottom cover 130 and are electrically connected with a host control part or the like provided on a main body side of the optical device.

(Operations and Effects)

In the optical unit 101 with a shake correction function 101 structured as described above, for pitching and yawing, the movable body 20 is swung around the first axial line "R1" or the second axial line "R2" by the gimbal mechanism (swing support mechanism) 30 and the shake correction drive mechanism 40 to correct a shake. In correct control for the shake, the movable body 20 is swung as shown by the arrow in FIG. 16B and, when one of the corner parts 224a and 224b of the support plate parts 224 of the holder frame 220 is abutted with the surface 122a of the protruded part 122 of the cover frame 120, further swing is restricted. An angle "θ" when the corner parts 224a and 224b of the support plate part 224 is abutted with the protruded part 122 of the cover frame 120 is, for example, set at 10°, and the swing range is restricted in the angular range.

Figure 16A:
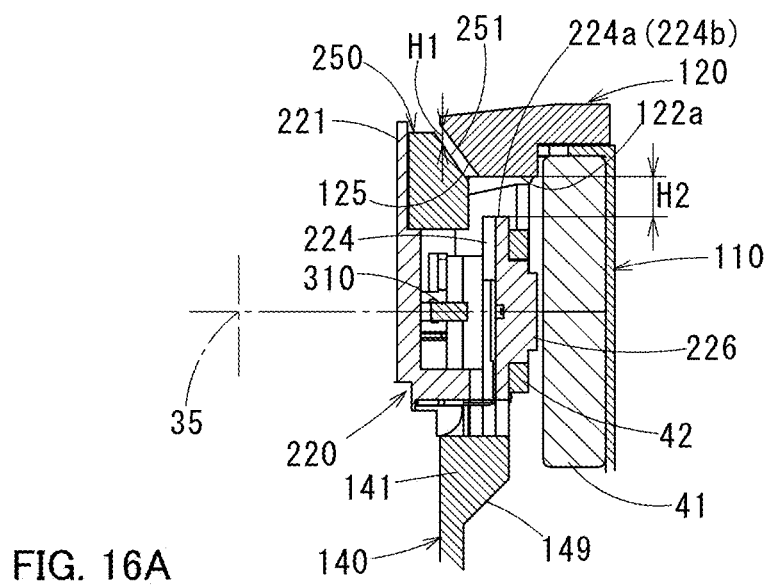
FIG. 16A and FIG. 16B are enlarged cross-sectional views showing a part of an optical unit with a shake correction function in FIG. 14.
Figure 16B:
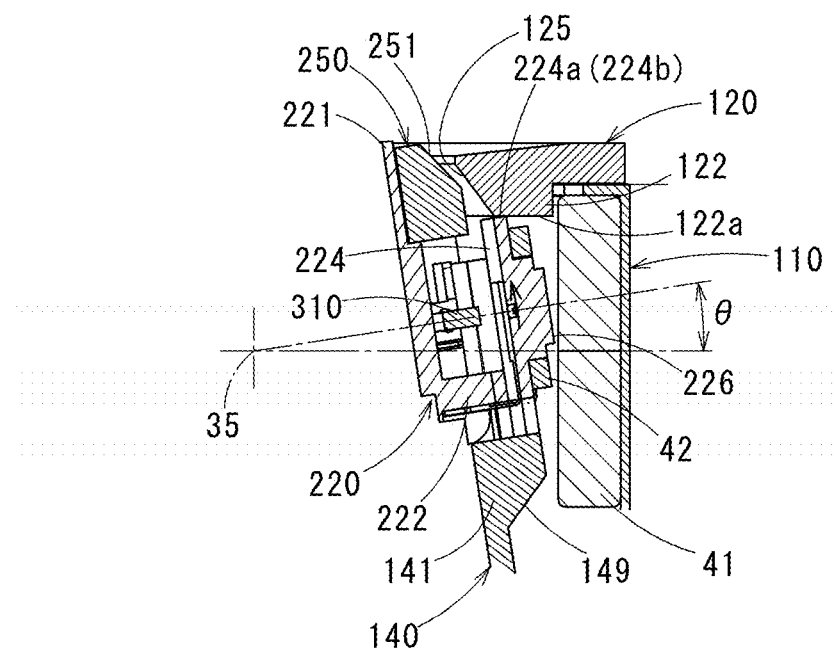

In this case, the gravity center adjustment member 230 is also swung together with the holder frame 220. However, the inclined face 251 of its outer peripheral part and the inclined face 125 of the inner peripheral part of the cover frame 120 are not contacted with each other as described above and the swing is not obstructed. Further, the protruded part 226 of the holder frame 220 which faces the magnet 41 of the fixed body 10 is also provided so as to have a predetermined space between the magnet 41 and the protruded part 226, and the protruded part 226 is not contacted with the magnet 41 at the time of swinging. Further, the support parts 141 and 142 of the spacer member 140 are attached to the holder frame 220 and thus the support parts 141 and 142 are also come close to the magnet 41. However, the support parts 141 and 142 are provided with the chamfer parts 149 and thus the support parts 141 and 142 are not contacted with the magnet 41 at a time of a swing as shown in FIG. 16B. In addition, tip ends of the stopper protruded parts 144 and 145 of the spacer member 140 are formed in a circular arc shape and are separated from the bottom plate part 133 of the bottom cover 130 and thus, the stopper protruded parts 144 and 145 are not also contacted at a time of a swing.

On the other hand, in a case that the movable body 20 is moved in the optical axis direction due to a drop impact or the like, when the inclined face 251 of the gravity center adjustment member 230 is abutted with the inclined face 125 of the inner peripheral part of the cover frame 120, further movement is restricted. In this case, the upper end (tip end on the "+Z" side in the "Z"-axis direction) having the corner parts 224a and 224b of the support plate part 224 of the holder frame 220 does not reach to the surface 122a of the protruded part 122 of the cover frame 120. On the other hand, in a case that the movable body 20 is moved to an opposite side to an object side in the optical axis direction, the stopper protruded parts 144 and 145 of the spacer member 140 is abutted with the bottom plate part 133 of the bottom cover 130 and further movement is restricted.

In a movement in the optical axis direction due to a drop impact or the like, a large impact is applied between the gravity center adjustment member 250 and the cover frame 120 or between the stopper protruded parts 144 and 145 of the spacer member 140 and the bottom plate part 133 of the bottom cover 130. However, in this case, the members different from the optical module are contacted with each other and thus an impact force is not directly applied to the optical module 210. In addition, the gravity center adjustment member 250 and the stopper protruded parts 144 and 145 of the spacer member 140 are arranged so as not to overlap with the optical module 210 (especially, the image pickup element 212) in the optical axis direction and thus, even if they are deformed by an impact, the optical module 210 is restrained from being affected. In this embodiment, the stopper protruded parts 144 and 145 of the spacer member 140 are provided in a connected state through the bridge part 143 and thus strength enduring an impact can be secured.

As described above, in the optical unit 101 with a shake correction function in this embodiment, a swing allowable range of the movable body 20 is restricted by the corner parts 224a and 224b of the support plate part 224 of the holder frame 220 and the surface 122a of the protruded part 122 of the cover frame 120 and, when an impact due to dropping and the like is applied, jumping-out in the optical axis direction of the movable body 20 is restricted by the inclined face 251 of the gravity center adjustment member 250 and the inclined face 125 of the cover frame 120, and a movement of the movable body 20 to an opposite side to an object side can be restricted by the stopper protruded parts 144 and 145 of the spacer member 140 and the bottom plate part 133 of the bottom cover 130. Further, when the movable body 20 is moved in the direction perpendicular to the optical axis "L", the protruded part 226 of the holder frame 220 and the magnet 41 are abutted with each other and further movement is restricted. Therefore, according to the optical unit, excessive deformation of the movable frame 310 of the gimbal mechanism 30 and the like can be prevented and the durability is enhanced.

Although the present invention has been shown and described with reference to a specific embodiment, various changes and modifications will be apparent to those skilled in the art from the teachings herein. For example, the gimbal mechanism 30 is structured so that the spherical body 320 fixed to the movable frame 310 is contacted with the contact point spring 330. However, a spherical body may not be necessarily used. It may be structured that a spherical-shaped tip end face which is a tip end face of a bar-shaped member formed in a spherical shape is contacted with a contact point spring.

Further, in the embodiment described above, the optical unit having correcting functions of pitching and yawing has been described. However, the optical unit may be structured to have a correcting function of rolling in addition to pitching and yawing. Further, in the embodiment described above, the magnet 41 of the shake correction drive mechanism 40 is provided in the case 110 of the fixed body 10 and the coil 42 is provided in the holder frame 220 of the movable body 20. However, it may be structured that the magnet 41 is provided in the holder frame 220 of the movable body 20 and the coil 42 is provided in the case 110 of the fixed body 10.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An optical unit with a shake correction function comprising:
    an optical module comprising an optical element and an image pickup element located on an optical axis of the optical element;
    a movable body which holds the optical module;
    a swing support mechanism which swingably supports the movable body;
    a fixed body which supports the movable body through the swing support mechanism;
    a shake correction drive mechanism structured to swing the movable body; and
    a stopper mechanism structured to restrict a movable range of the movable body when the movable body is moved in a direction of the optical axis;
    wherein the stopper mechanism comprises:
        a spacer member which is provided in the movable body and comprises a stopper protruded part extended to an opposite side to an object to be photographed in the direction of the optical axis with respect to the image pickup element; and
        a stopper member structured to abut with the stopper protruded part of the spacer member when the movable body is moved to the opposite side to the object to be photographed along the direction of the optical axis;
    wherein the spacer member is fixed to a member different from the optical module in the movable body;
    wherein the stopper protruded part comprises a first protruded part and a second protruded part which are separated from each other in a direction perpendicular to the direction of the optical axis so that the image pickup element is interposed between the first protruded part and the second protruded part;
    wherein the first protruded part and the second protruded part are connected with each other through a bridge part which is a connection part connecting the first protruded part with the second protruded part at a position separated from the image pickup element on an opposite side to the object to be photographed in the direction of the optical axis; and
    wherein the bridge part comprises a circuit board receiving part which supports a flexible circuit board electrically connected with the image pickup element in a state that the flexible circuit board is extended along an under face of the bridge part and is disposed between the first protruded part and the second protruded part.

2. The optical unit with a shake correction function according to claim 1, wherein
    the shake correction drive mechanism comprises a magnet and a coil,
    the movable body comprises a holder frame which holds one of the magnet and the coil of the shake correction drive mechanism, and
    the spacer member is abutted with the holder frame through a face intersecting the direction of the optical axis.

3. The optical unit with a shake correction function according to claim 2, wherein the spacer member comprises a chamfer part for avoiding contact with the magnet or the coil provided in the fixed body at a time of a swing on an outer side face of a portion of the spacer member abutting with the holder frame.

4. The optical unit with a shake correction function according to claim 1, wherein a tip end of each of the first protruded part and the second protruded part facing the stopper member is formed in a circular arc shape with a swing center position of the swing support mechanism as a swing center when viewed in a direction perpendicular to the direction of the optical axis.

5. The optical unit with a shake correction function according to claim 4, wherein the circular arc shapes of the tip ends of the first protruded part and the second protruded part are formed in a same direction as each other.

* * * * *